(12) United States Patent
Saito

(10) Patent No.: US 9,787,294 B2
(45) Date of Patent: Oct. 10, 2017

(54) PULSE CONVERTER CIRCUIT

(71) Applicant: Semiconductor Energy Laboratory Co., Ltd., Atsugi-shi, Kanagawa-ken (JP)

(72) Inventor: Toshihiko Saito, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/936,292

(22) Filed: Nov. 9, 2015

(65) Prior Publication Data
US 2016/0065191 A1 Mar. 3, 2016

Related U.S. Application Data

(62) Division of application No. 13/107,167, filed on May 13, 2011, now Pat. No. 9,209,206.

(30) Foreign Application Priority Data

May 21, 2010 (JP) ................................. 2010-116861

(51) Int. Cl.
*H03K 3/017* (2006.01)
*H01L 27/12* (2006.01)
(Continued)

(52) U.S. Cl.
CPC ............ *H03K 5/04* (2013.01); *H01L 27/092* (2013.01); *H01L 27/1233* (2013.01);
(Continued)

(58) Field of Classification Search
CPC .. H03K 7/08; H03K 5/04; H03K 5/05; H03K 5/1565; H03K 19/0016; H03K 19/00315;
(Continued)

(56) References Cited

U.S. PATENT DOCUMENTS 5,463,240 A 10/1995 Watanabe
5,629,638 A 5/1997 Kumar
(Continued)

FOREIGN PATENT DOCUMENTS

EP 0653843 A 5/1995
EP 1737044 A 12/2006
(Continued)

OTHER PUBLICATIONS

Chinese Office Action (Application No. 201110148651.1) Dated Dec. 3, 2014.
(Continued)

*Primary Examiner* — Vibol Tan
(74) *Attorney, Agent, or Firm* — Robinson Intellectual Property Law Office; Eric J. Robinson

(57) ABSTRACT

A pulse converter circuit includes a logic circuit to which a first signal is input and from which a second signal is output. The logic circuit includes a p-channel transistor which determines whether a voltage of the second signal is set to a first voltage depending on a voltage of the gate; and an n-channel transistor which determines whether the voltage of the second signal is set to a second voltage, which is higher than the first voltage, depending on a voltage of the gate. The p-channel transistor includes a semiconductor layer containing an element of a group 14. The n-channel transistor includes an oxide semiconductor layer.

4 Claims, 20 Drawing Sheets

(51) Int. Cl.
   *H01L 29/786* (2006.01)
   *H03K 5/04* (2006.01)
   *H01L 27/092* (2006.01)

(52) U.S. Cl.
   CPC ...... *H01L 27/1237* (2013.01); *H01L 27/1251* (2013.01); *H01L 29/7869* (2013.01)

(58) Field of Classification Search
   CPC ................ G11C 7/22; H01L 21/02554; H01L 21/02565; H01L 27/12
   See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,084,453 A | 7/2000 | Fuse et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,180,363 B2 * | 2/2007 | Parris ................ H03K 19/0016 327/544 | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,414,877 B2 * | 8/2008 | Burnett ................ G11C 11/412 365/154 | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,550,772 B2 | 6/2009 | Toyota et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,863,611 B2 | 1/2011 | Abe et al. | |
| 7,952,392 B2 | 5/2011 | Koyama et al. | |
| 8,106,400 B2 | 1/2012 | Miyairi et al. | |
| 8,203,146 B2 | 6/2012 | Abe et al. | |
| 8,237,166 B2 | 8/2012 | Kumomi et al. | |
| 8,283,662 B2 | 10/2012 | Saito | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0150045 A1 | 8/2004 | Nonaka et al. | |
| 2005/0017302 A1 | 1/2005 | Hoffman | |
| 2005/0199959 A1 | 9/2005 | Chiang et al. | |
| 2006/0022742 A1 | 2/2006 | Parris et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0103427 A1 | 5/2006 | Bhattacharya et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 * | 6/2006 | Abe ................ H01L 29/7869 257/197 | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0238222 A1 | 10/2006 | Ajiki | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252145 A1 | 11/2007 | Toyota et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0189153 A1 | 7/2009 | Iwasaki et al. | |
| 2009/0278122 A1 | 11/2009 | Hosono et al. | |
| 2009/0280600 A1 | 11/2009 | Hosono et al. | |
| 2009/0286393 A1 | 11/2009 | Mathew et al. | |
| 2010/0065844 A1 | 3/2010 | Tokunaga | |
| 2010/0084650 A1 | 4/2010 | Yamazaki et al. | |
| 2010/0085081 A1 | 4/2010 | Ofuji et al. | |
| 2010/0092800 A1 | 4/2010 | Itagaki et al. | |
| 2010/0109002 A1 | 5/2010 | Itagaki et al. | |
| 2010/0193785 A1 | 8/2010 | Kimura | |
| 2012/0195115 A1 | 8/2012 | Fujita et al. | |
| 2014/0070211 A1 | 3/2014 | Iwasaki et al. | |

FOREIGN PATENT DOCUMENTS

| | | |
|---|---|---|
| EP | 2149910 A | 2/2010 |
| EP | 2149911 A | 2/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-130869 A | 5/1995 |
| JP | 07-202677 A | 8/1995 |

(56) References Cited

FOREIGN PATENT DOCUMENTS

| JP | 07-202679 A | 8/1995 |
|---|---|---|
| JP | 08-264794 A | 10/1996 |
| JP | 11-027113 A | 1/1999 |
| JP | 11-505377 | 5/1999 |
| JP | 11-233789 A | 8/1999 |
| JP | 2000-044236 A | 2/2000 |
| JP | 2000-150900 A | 5/2000 |
| JP | 2001-053164 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-188266 A | 7/2003 |
| JP | 2004-103957 A | 4/2004 |
| JP | 2004-200426 A | 7/2004 |
| JP | 2004-273614 A | 9/2004 |
| JP | 2004-273732 A | 9/2004 |
| JP | 2005-311624 A | 11/2005 |
| JP | 2006-165528 A | 6/2006 |
| JP | 2006-165532 A | 6/2006 |
| JP | 2007-281409 A | 10/2007 |
| JP | 2007-298649 A | 11/2007 |
| WO | WO-2004/114391 | 12/2004 |
| WO | WO-2007/032294 | 3/2007 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 72104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

900

902

901

903

PULSE CONVERTER CIRCUIT

BACKGROUND OF THE INVENTION

1. Field of the Invention

One embodiment of the present invention relates to a pulse converter circuit.

2. Description of the Related Art

In order to control a timing when a pulse of a signal is input to a given circuit, a circuit (also referred to as a pulse converter circuit) which generates and outputs a signal having a pulse width different from that of an input signal in response to the input signal is known.

An example of a conventional pulse converter circuit is a circuit including an inverter (for example, see Patent Document 1).

REFERENCE

[Patent Document 1] Japanese Published Patent Application No. H7-202677

SUMMARY OF THE INVENTION

A conventional pulse converter circuit changes a pulse width utilizing transistors with different sizes or an increased number of transistors in an inverter; therefore, a circuit area of the inverter is large. The large area of the inverter poses a problem in that a reduction in size of a device including the pulse converter circuit is prevented.

An object of one embodiment of the present invention is to reduce a circuit area.

One embodiment of the present invention is a pulse converter circuit including a logic circuit including a p-channel transistor and an n-channel transistor, in which a material of a layer where a channel is formed (also referred to as a channel formation layer) in the p-channel transistor and a material of a channel formation layer in the n-channel transistor are different from each other, so that a delay time of a pulse of an output signal with respect to an input signal at rising of the signals is different from that at falling of the signals.

One embodiment of the present invention is a pulse converter circuit including a logic circuit to which a first signal is input and from which a second signal is output. The logic circuit includes a p-channel transistor to a gate of which the first signal is input, the p-channel transistor determining whether a voltage of the second signal is set to a first voltage or not depending on a voltage of the gate; and an n-channel transistor which is of an enhancement mode, and has a larger absolute value of a threshold voltage than that of the p-channel transistor, and to a gate of which the first signal is input, the n-channel transistor determining whether the voltage of the second signal is set to a second voltage, which is higher than the first voltage, or not depending on a voltage of the gate. The p-channel transistor includes a semiconductor layer in which a channel is formed and a group 14 element is included. The n-channel transistor includes an oxide semiconductor layer in which a channel is formed and a carrier concentration is less than $1 \times 10^{14}/cm^3$.

One embodiment of the present invention is a pulse converter circuit including a first inverter to which a first signal is input and from which a second signal is output; and a second inverter to which the second signal is input and from which a third signal is output. The first inverter includes a p-channel transistor to a gate of which the first signal is input, the p-channel transistor determining whether a voltage of the second signal is set to a first voltage or not depending on a voltage of the gate; and an n-channel transistor which is of an enhancement mode, and has a larger absolute value of a threshold voltage than that of the p-channel transistor, and to a gate of which the first signal is input, the n-channel transistor determining whether the voltage of the second signal is set to a second voltage, which is lower than the first voltage, or not depending on a voltage of the gate. The p-channel transistor includes a semiconductor layer in which a channel is formed and a group 14 element is included. The n-channel transistor includes an oxide semiconductor layer in which a channel is formed and a carrier concentration is less than $1 \times 10^{14}/cm^3$.

One embodiment of the present invention is a pulse converter circuit including a first inverter to which a first signal is input and from which a second signal is output; and a second inverter to which the second signal is input and from which a third signal is output. The second inverter includes a p-channel transistor to a gate of which the second signal is input, the p-channel transistor determining whether a voltage of the third signal is set to a first voltage or not depending on a voltage of the gate; and an n-channel transistor which is of an enhancement mode, and has a larger absolute value of a threshold voltage than that of the p-channel transistor, and to a gate of which the second signal is input, the n-channel transistor determining whether the voltage of the third signal is set to a second voltage, which is lower than the first voltage, or not depending on a voltage of the gate. The p-channel transistor includes a semiconductor layer in which a channel is formed and a group 14 element is included. The n-channel transistor includes an oxide semiconductor layer in which a channel is formed and a carrier concentration is less than $1 \times 10^{14}/cm^3$.

Note that in this specification, "rise" refers to a change in a signal from a given voltage to a higher voltage, while "fall" refers to a change from a given voltage to a lower voltage.

According to one embodiment of the present invention, a pulse converter circuit can be formed using two transistors whose conductivity and materials of the channel formation layers are different from each other; therefore, the area of the pulse converter circuit can be reduced.

DETAILED DESCRIPTION OF THE INVENTION

Examples of embodiments of the present invention will be described below with reference to the drawings. Note that the present invention is not limited to the following description, and it will be readily appreciated by those skilled in the art that various changes and modifications can be made without departing from the spirit and scope of the invention. Thus, the present invention should not be construed as being limited to the description in the following embodiments.

Note that the contents in different embodiments can be combined with one another as appropriate. In addition, the contents in different embodiments can be interchanged one another.

(Embodiment 1)

In this embodiment, a pulse converter circuit whose output signal has different delay times with respect to an input signal at the rising and the falling will be described.

Figure 1A:
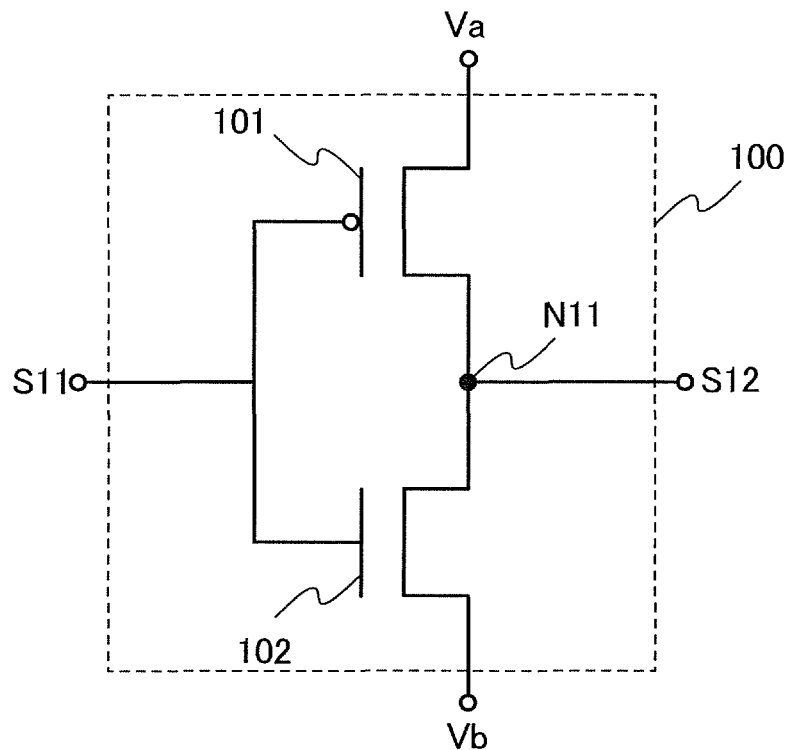
FIGS. 1A and 1B illustrate a pulse converter circuit in Embodiment 1.
Figure 1B:
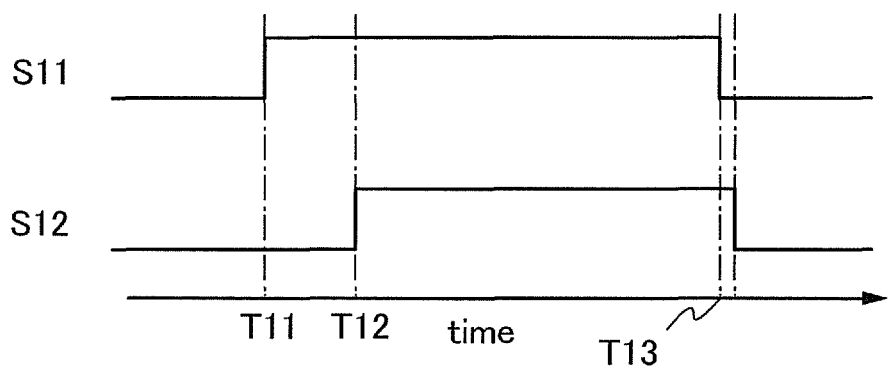

An example of a pulse converter circuit in this embodiment will be described with reference to FIGS. 1A and 1B. FIGS. 1A and 1B illustrate an example of the pulse converter circuit in this embodiment.

First, an example of a structure of the pulse converter circuit in this embodiment will be described with reference to FIG. 1A. FIG. 1A is a circuit diagram showing an example of a structure of the pulse converter circuit in this embodiment.

The pulse converter circuit in FIG. 1A includes a logic circuit 100.

A signal S11 is input to the logic circuit 100. A signal S12 is output from the logic circuit 100.

Further, the logic circuit 100 includes a transistor 101 and a transistor 102.

Note that in the pulse converter circuit, the transistor includes at least a source, a drain, and a gate unless otherwise specified.

The source refers to part or the whole of a source region, a source electrode, and a source wiring. A conductive layer having a function of both a source electrode and a source wiring is referred to as a source in some cases without distinction between a source electrode and a source wiring.

The drain refers to part or the whole of a drain region, a drain electrode, and a drain wiring. A conductive layer having a function of both a drain electrode and a drain wiring is referred to as a drain in some cases without distinction between a drain electrode and a drain wiring.

The gate refers to part or the whole of a gate electrode, and a gate wiring. A conductive layer having a function of both a gate electrode and a gate wiring is referred to as a gate in some cases without distinction between a gate electrode and a gate wiring.

Further, the source and the drain of the transistor may be interchanged in some cases, depending on the structure, the operating condition, or the like of the transistor.

A voltage Va is input to one of the source and the drain of the transistor 101, the signal S11 is input to a gate of the transistor 101. Note that the transistor 101 is a p-channel transistor. The transistor 101 has a function of determining whether the voltage of the signal S12 is set to a voltage V11 or not depending on the voltage of the gate.

The transistor 101 can be, for example, a transistor including a semiconductor layer in which a channel is formed and a semiconductor (such as silicon) belonging to the 14th group of the periodic table is included.

One of a source and a drain of the transistor 102 is electrically connected to the other of the source and the drain of the transistor 101. A voltage Vb is input to the other of the source and the drain of the transistor 102, and the signal S11 is input to a gate of the transistor 102. Note that the transistor 102 is an n-channel transistor. The transistor 102 has a function of determining whether the voltage of the signal S12 is set to a voltage V12 or not depending on the voltage of the gate.

The transistor 102 can be an enhancement mode transistor having a larger absolute value of a threshold voltage than that of the transistor 101; for example, the transistor 102 can be a transistor including an oxide semiconductor layer. The oxide semiconductor layer serves as a layer where a channel is formed (also referred to as a channel formation layer). In addition, the oxide semiconductor layer is an intrinsic (or i-type) or substantially intrinsic semiconductor layer in which the number of carriers is very small and the carrier concentration is less than $1 \times 10^{14}/cm^3$, preferably less than $1 \times 10^{12}/cm^3$, more preferably less than $1 \times 10^{11}/cm^3$.

The off-state current per micrometer of the channel width of the transistor including an oxide semiconductor layer serving as a channel formation layer is less than or equal to 10 aA ($1 \times 10^{-17}$ A), preferably less than or equal to 1 aA ($1 \times 10^{-18}$ A), further preferably less than or equal to 10 zA ($1 \times 10^{-20}$ A), further preferably less than or equal to 1 zA ($1 \times 10^{-21}$ A), much further preferably less than or equal to 100 yA ($1 \times 10^{-22}$ A).

In addition, since the oxide semiconductor layer has low carrier concentration, the off-state current of the transistor including an oxide semiconductor layer is in the above ranges even when the temperature changes. For example, when the temperature of the transistor is 150° C., the off-state current is preferably 100 zA/μm or less.

A portion where the one of the source and the drain of the transistor 102 and the other of the source and the drain of the transistor 101 are electrically connected to each other is referred to as a node N11.

The pulse converter circuit in FIG. 1A outputs the voltage of the node N11 as the signal S12. In other words, the voltage of the one of the source and the drain of the transistor 102 is the voltage of the signal S12.

Note that voltage generally refers to a difference between potentials at two points (also referred to as a potential difference). However, values of both voltage and potential are expressed in volt (V) in a circuit diagram or the like in some cases; therefore, it is difficult to discriminate between potential and voltage. Thus, in this specification, a potential difference between a potential at one point and a potential to be the reference (also referred to as a reference potential) is regarded as a voltage of the point in some cases unless otherwise specified.

Note that one of the voltage Va and the voltage Vb is a high power supply voltage Vdd, and the other is a low power supply voltage Vss. The high supply voltage Vdd is a voltage which is relatively higher than the low supply voltage Vss. The low supply voltage Vss is a voltage which is relatively lower than that of the high supply voltage Vdd. The value of the voltage Va and the value of the voltage Vb might interchange depending, for example, on the conductivity type of the transistors. The difference between the voltage Va and the voltage Vb is a power supply voltage.

Next, an example of an operation of the pulse converter circuit in FIG. 1A will be described with reference to FIG. 1B. FIG. 1B is a timing diagram of an example of an operation of the pulse converter circuit in FIG. 1A. Here, an example where the low power supply voltage Vss is input as the voltage Va and the high power supply voltage Vdd is input as the voltage Vb is given.

For example, as shown in FIG. 1B, when the signal S11 rises at a time T11, the transistor 101 turns off and the transistor 102 turns on.

Here, the transistor 102 provides a delay, whereby the signal S12 rises at a time T12 later than the time T11.

Then, when the signal S11 falls at a time T13, the transistor 101 turns on and the transistor 102 turns off.

At this time, the transistor 101 provides a delay, whereby the signal S12 falls at a time later than the time T13. Note that the delay time of the signal S12 at the rising is longer than that at the falling. The reason thereof will be given below.

In the case where the transistor 102 is an enhancement mode transistor, the absolute value of the threshold voltage of the transistor 102 is larger than that of the transistor 101, and the carrier concentration of the transistor 102 is much lower than that of the transistor 101; the time it takes for the transistor 102 to be switched from an on state is longer than that for the transistor 101 in the pulse converter circuit. Therefore, the delay time of the signal S12 at the rising is longer than that at the falling.

As described with reference to FIGS. 1A and 1B, the pulse converter circuit given as an example in this embodiment includes a p-channel transistor and an n-channel transistor: the p-channel transistor determines whether the voltage of the output signal is set to a first voltage or not depending on the signal input to the gate, while the n-channel transistor, which includes a material of a channel formation layer different from that of the p-channel transistor, is of an enhancement mode, and has a larger absolute value of the threshold voltage than that of the p-channel transistor, and determines whether the voltage of the output signal is set to a second voltage or not depending on the signal input to the gate. With the above structure, the pulse converter circuit can be formed even when only two transistors are used. In addition, the pulse converter circuit can be formed with transistors having the same size. Therefore, the circuit area of the pulse converter circuit can be reduced.

(Embodiment 2)

In this embodiment, a pulse converter circuit including a plurality of inverters will be described.

Figure 2A:
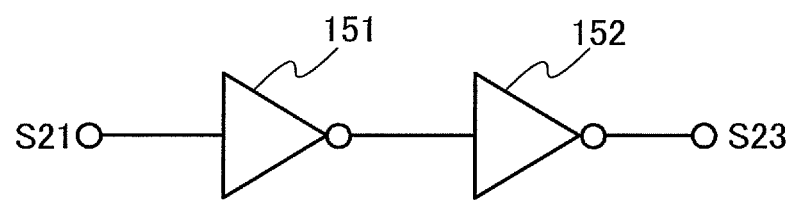
FIGS. 2A and 2B illustrate a pulse converter circuit in Embodiment 2.
Figure 2B:
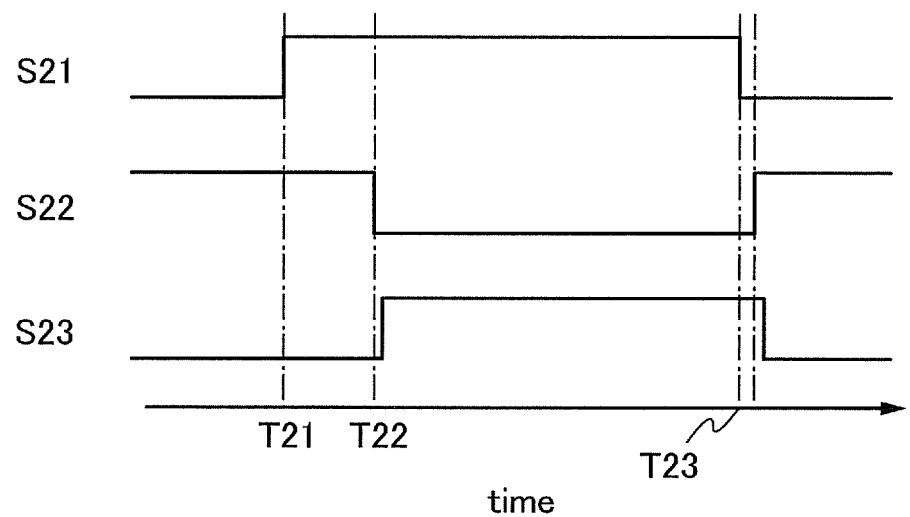

An example of a pulse converter circuit in this embodiment will be described with reference to FIGS. 2A and 2B. FIGS. 2A and 2B illustrate an example of the pulse converter circuit in this embodiment.

First, an example of a structure of the pulse converter circuit in this embodiment will be described with reference to FIG. 2A. FIG. 2A is a circuit diagram showing an example of a structure of the pulse converter circuit in this embodiment.

The pulse converter circuit in FIG. 2A includes an inverter 151 and an inverter 152. Note that the inverters are not limited thereto as long as a plurality of transistors are included.

A signal S21 is input to the inverter 151. The inverter 151 outputs a signal S22 which is a voltage set according to the input signal S21.

The signal S22 is input to the inverter 152. The inverter 152 outputs the signal S23 which is a voltage set according to the input signal S22. Note that the signal S22 is not necessarily directly input to the inverter 152. For example, another signal having a voltage set according to the signal S22 may be generated using another circuit and input to the inverter 152. In such a case, the voltage of the signal S23 can be regarded as being set according to the signal S22.

The inverter 151 and the inverter 152 may each have a structure of the above logic circuit in Embodiment 1. Alternatively, one of the inverter 151 and the inverter 152 may have a structure of the above logic circuit in Embodiment 1 and the other of the inverter 151 and the inverter 152 may have a structure of a conventional inverter. In these cases, the voltage Va is the high power supply voltage Vdd and the voltage Vb is the low power supply voltage Vss.

Next, an example of an operation of the pulse converter circuit in FIG. 2A will be described with reference to FIG. 2B. FIG. 2B is a timing diagram of an example of an operation of the pulse converter circuit in FIG. 2A. Note that FIG. 2B illustrates the case where the inverter 151 has a structure of the logic circuit in FIG. 1A and the inverter 152 has a structure of a conventional inverter, for example.

For example, as in FIG. 2B, when the signal S21 rises at a time T21, an n-channel transistor in the inverter 151 provides a delay, whereby the signal S22 falls at a time T22 later than the time T21. In addition, when the signal S22 falls at the time T22, a p-channel transistor in the inverter 152 provides a delay, whereby the signal S23 rises at a time later than the time T22.

After that, when the signal S21 falls at a time T23, a p-channel transistor in the inverter 151 provides a delay, whereby the signal S22 rises at a time later than the time T23. In addition, when the signal S22 rises, an n-channel transistor in the inverter 152 provides a delay, whereby the signal S23 falls at a time later than the time T23. Note that the delay time of the signal S23 with respect to the signal S21 at the rising is longer than that at the falling. The reason thereof is the same as that described above in Embodiment 1.

An operation test of the pulse converter circuit in FIG. 2A was conducted. Note that Gateway Ver.2.6.12.R was used as a calculation software in the operation test. Here, the operation test was conducted on the following cases. In Structure 1, both of the inverter 151 and the inverter 152 have a structure of a conventional inverter. In Structure 2, the inverter 151 has a structure of the logic circuit 100 in FIG. 1A and the inverter 152 has a structure of a conventional inverter. In Structure 3, the inverter 151 has a structure of a conventional inverter and the inverter 152 has a structure of the logic circuit 100 in FIG. 1A. As a conventional inverter, a CMOS inverter including an n-channel transistor and p-channel transistor each including a silicon semiconductor layer where a channel was formed was used. In addition, in the operation test, the transistors used are as follows: the n-channel transistor including an oxide semiconductor layer in the pulse converter circuit which has a channel width of 1 μm, a channel length of 1 μm, a threshold voltage of 1.58 V, an S value of 100 mV/dec, an off-state current (a current between a source and a drain at a gate-source voltage of 0 V) of $2.0 \times 10^{-24}$ A, and an on-state current (a current between a source and a drain at a gate-source voltage of 2 V) of $7.8 \times 10^{-7}$ A; the n-channel transistor in a conventional inverter which has a channel width of 1 μm, a channel length of 1 μm, a threshold voltage of 0.42 V, an S value of 60 mV/dec, an off-state current (a current between a source and a drain at a gate-source voltage of 0 V) of $3.9 \times 10^{-12}$ A, and an on-state current (a current between a source and a drain at a gate-source voltage of 2 V) of $7.4 \times 10^{-5}$ A; and the p-channel transistor which has a channel width of 1 μm, a channel length of 1 μm, a threshold voltage of −0.52 V, an S value of 90 mV/dec, an off-state current (a current between a source and a drain at a gate-source voltage of 0 V) of $8.2 \times 10^{-12}$ A, and an on-state current (a current between a source and a drain at a gate-source voltage of −2 V) of $7.3 \times 10^{-5}$ A. In the operation test, an amplitude of the signal S21 was 0 V to 2 V, and the power supply voltage was 2 V.

Figure 3A:
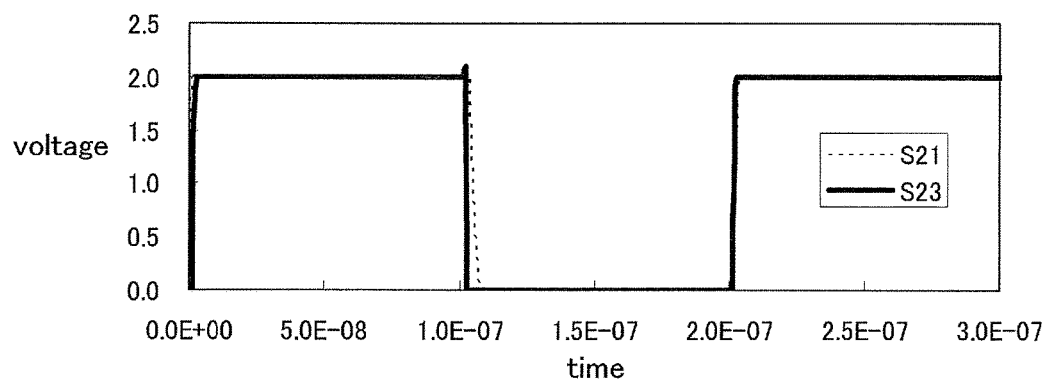
FIGS. 3A to 3C show results of an operation test of the pulse converter circuit in FIG. 2A.
Figure 3B:
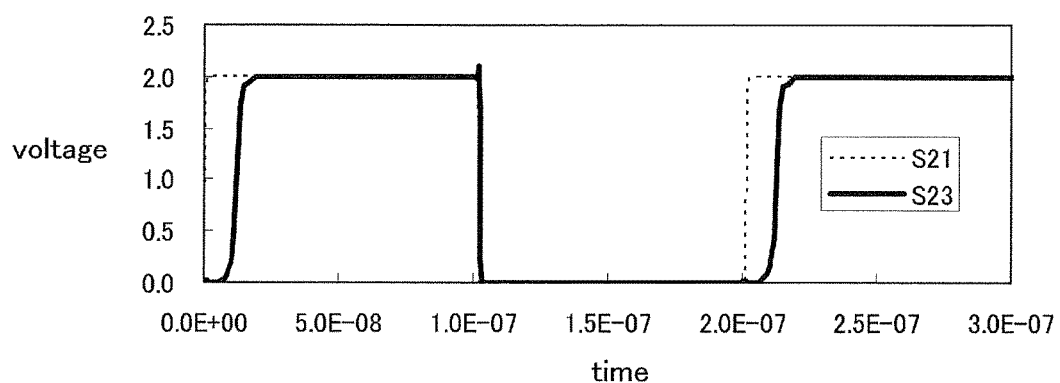
Figure 3C:
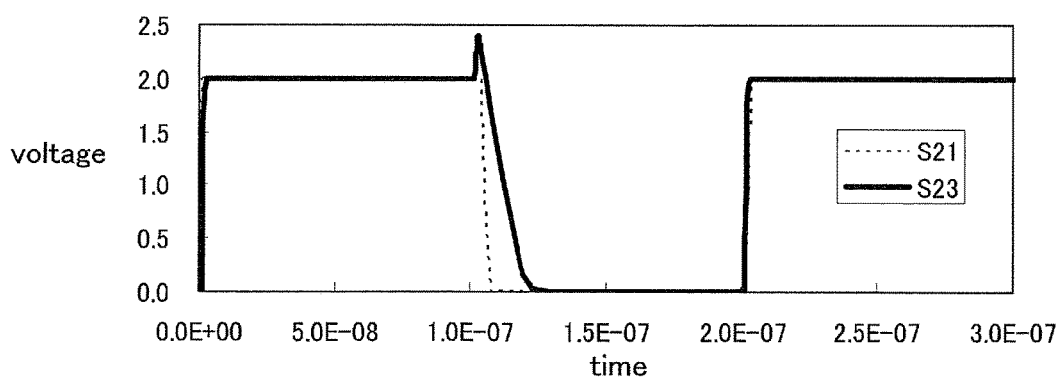

The result of the operation test is described with reference to FIGS. 3A to 3C. FIGS. 3A to 3C show results of the operation test of the pulse converter circuit in FIG. 2A.

FIG. 3A shows the voltage waveforms of the signal S21 and the signal S23 in Structure 1; FIG. 3B shows the voltage waveforms of the signal S21 and the signal S23 in Structure 2; and FIG. 3C shows the voltage waveforms of the signal S21 and the signal S23 in Structure 3. As in FIGS. 3A to 3C, in Structure 1, a delay time of the signal S23 is short at the rising and falling. In contrast, in Structure 2, a delay time of the signal S23 at the rising is longer than that at the falling; in Structure 3, a delay time of the signal S23 at the falling is longer than that at the rising.

As described in FIGS. 2A and 2B and FIGS. 3A to 3C, the pulse converter circuit given as an example in this embodiment includes at least a first inverter and a second inverter, and one of the first inverter and the second inverter includes a p-channel transistor and an n-channel transistor: the p-channel transistor determines whether the voltage of the output signal is set to a first voltage or not depending on the signal input to the gate, while the n-channel transistor, which includes a material of a channel formation layer different from that of the p-channel transistor, is of an enhancement mode, and has a larger absolute value of the threshold voltage than that of the p-channel transistor, and determines whether the voltage of the output signal is set to a second voltage or not depending on the signal input to the gate. With the above structure, the pulse converter circuit can be formed using two inverters. Thus, the voltage of the output signal can be equal to or greater than a power supply voltage, and the pulse converter circuit can be formed with transistors having the same size. Therefore, the circuit area of the pulse converter circuit can be reduced.

(Embodiment 3)

In this embodiment, an electronic circuit including the pulse converter circuit in the above embodiments will be described.

Figure 4:
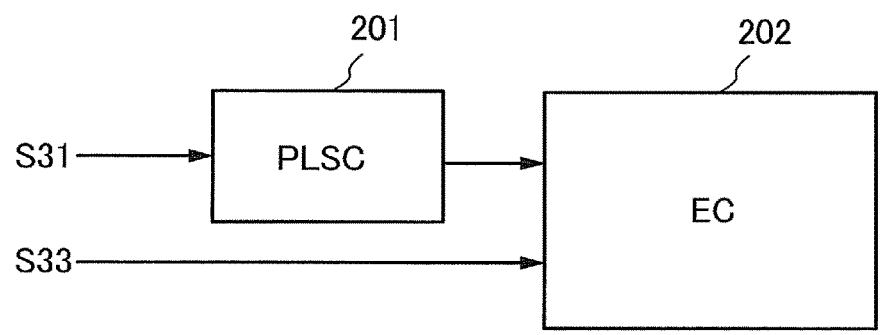
FIG. 4 is a block diagram illustrating an example of a structure of an electronic circuit in Embodiment 3.

An example of the electronic circuit in this embodiment will be described with reference to FIG. 4. FIG. 4 is a block diagram illustrating an example of a structure of the electronic circuit in this embodiment.

An electronic circuit in FIG. 4 includes a pulse converter circuit (also referred to as a PLSC) 201 and a functional circuit (also referred to as an EC) 202.

A signal S31 is input to the pulse converter circuit 201. The pulse converter circuit 201 has a function of outputting a signal S32 which is a voltage set according to the input signal S31.

A pulse converter circuit having the structure described in Embodiment 1 or Embodiment 2 can be used as the pulse converter circuit 201.

The signal S32 and a signal S33 are input to the functional circuit 202. The functional circuit 202 is a circuit having a specific function which operates according to the input signals S32 and S33.

The functional circuit 202 can be, for example, a logic circuit, a display circuit, or a memory circuit.

Note that the signal S31 and the signal S33 may be synchronized with the same clock signal.

While the case where the signal S33 is directly input to the functional circuit 202 is shown in FIG. 4, it is not limited thereto. A structure where a buffer circuit or the like to which the signal S33 is input is provided and an output signal from the buffer circuit which is set according to the signal S33 is input to the functional circuit 202 is also acceptable.

Figure 5A:
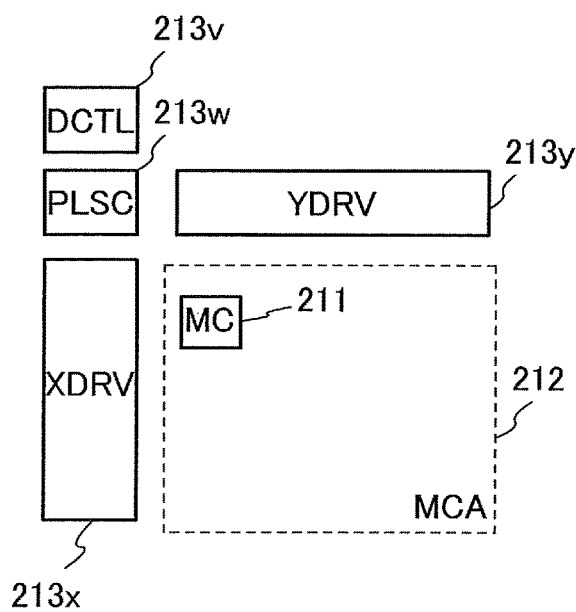
FIGS. 5A to 5C show a memory circuit in Embodiment 3.
Figure 5B:
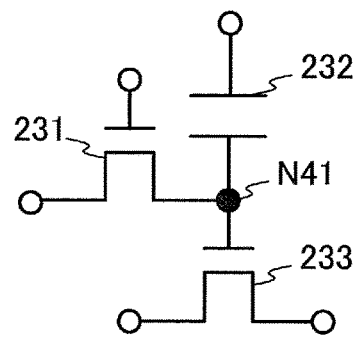
Figure 5C:
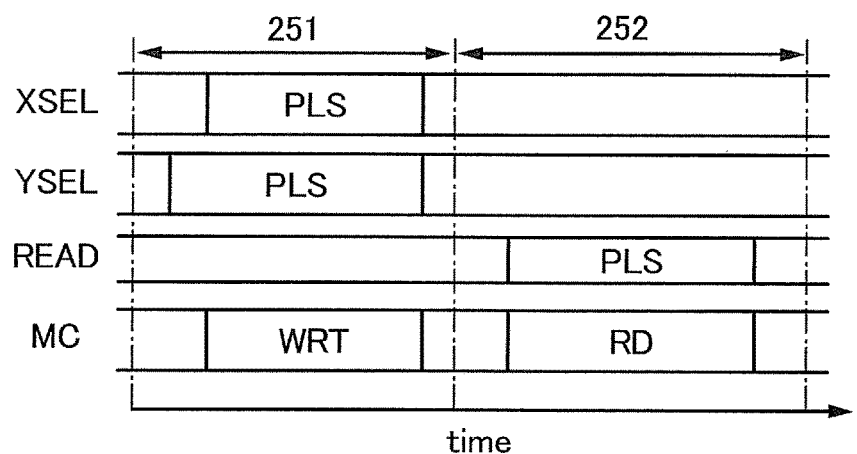

Next, a memory circuit will be described as an example of the electronic circuit in this embodiment with reference to FIGS. 5A to 5C. FIGS. 5A to 5C are diagrams for showing the memory circuit in this embodiment.

An example of a structure of the memory circuit in this embodiment will be described with reference to FIG. 5A. FIG. 5A is a block diagram illustrating an example of a structure of the memory circuit in this embodiment.

The memory circuit in FIG. 5A includes a plurality of memory cells (also referred to as MC) 211, a first driver circuit (also referred to as XDRV) 213x, a second driver circuit (also referred to as YDRV) 213y, a plurality of pulse converter circuits 213w, and a driver control circuit (also referred to as DCTL) 213v.

The memory cells 211 are arranged in rows and columns. A region where the memory cells 211 are provided is referred to as a memory cell array (also referred to as MCA) 212.

A row address signal (also referred to as a signal XSEL) is input to the first driver circuit 213x. The first driver circuit 213x has a function of selecting the memory cells 211 in one or more rows in response to the input row address signal and outputting a selection signal to the selected memory cells 211. The first driver circuit 213x includes a decoder, for example. The decoder has a function of selecting the memory cells 211 by row.

A data signal and a column address signal (also referred to as a signal YSEL) are input to the second driver circuit 213y. The second driver circuit 213y has a function of selecting the memory cells 211 in one of more columns in response to the input column address signal and outputting a data signal to the selected memory cells 211. The second driver circuit 213y has a function of outputting a read signal (also referred to as a signal READ) and reading out the data stored in the selected memory cell 211 by the read signal. The second driver circuit 213y includes a decoder, a plurality of analog switches, a read signal output circuit, and a read circuit, for example. The decoder has a function of selecting the memory cells 211 by column. The analog switch has a function of determining whether the data signal is output or not depending on a signal input from the decoder. The read signal output circuit has a function of generating and outputting the read signal. The read circuit has a function of reading out the data stored in the selected memory cells 211 by the read signal. Note that the voltage of the read signal can be lower than that of the write signal.

A write control signal, a read control signal, and an address signal are input to the driver control circuit 213*v*. The driver control circuit 213*v* has a function of generating and outputting signals which control an operation of the first driver circuit 213*x* and the second driver circuit 213*y* in response to the input write control signal, read control signal, and address signal. For example, the driver control circuit 213*v* has a function of outputting a plurality of row address signals to the first driver circuit 213*x* and a plurality of column address signals to the second driver circuit 213*y* in response to the address signal.

The row address signals and the column address signals are input to the pulse converter circuits 213*w*. Note that the number of pulse converter circuits 213*w* is the same as the number of input row address signals or the column address signal. The row address signals input to the respective pulse converter circuits 213*w* are different from one another, and the column address signals input to the respective pulse converter circuits 213*w* are different from one another. The pulse converter circuit 213*w* has a function of changing a pulse width of the signal input thereto. As the pulse converter circuit 213*w*, the pulse converter circuit in the above embodiments can be used. For example, the pulse converter circuit having Structure 2 in Embodiment 2 can be used in the case where the pulse width of the row address signal is changed; while the pulse converter circuit having Structure 3 in Embodiment 2 can be used in the case where the pulse width of the column address signal is changed.

An example of a structure of the memory cell 211 is described with reference to FIG. 5B. FIG. 5B is a circuit diagram illustrating an example of a structure of the memory cell.

The memory cell in FIG. 5B includes a transistor 231, a capacitor 232, and a transistor 233.

The data signal is input to one of a source and a drain of the transistor 231 and a selection signal is input to a gate of the transistor 231. The transistor 231 serves as a selection transistor.

As the transistor 231, a transistor which can be applied to the n-channel transistor of the logic circuit in the pulse converter circuit in Embodiment 1 cam be used, for example.

The capacitor 232 includes a first electrode and a second electrode. The read signal is input to the first electrode of the capacitor 232. The second electrode of the capacitor 232 is electrically connected to the other of the source and the drain of the transistor 231. The capacitor 232 serves as a storage capacitor.

A voltage Vc is input to one of a source and a drain of the transistor 233. The voltage of the other of the source and the drain of the transistor 233 is the voltage of a data signal which is to be read out. A gate of the transistor 233 is electrically connected to the other of the source and the drain of the transistor 231. Note that a portion where the gate of the transistor 233, the second electrode of the capacitor 232, and the other of the source and the drain of the transistor 231 are electrically connected to one another can also be referred to as a node N41. The voltage Vc has a predetermined value. Note that the transistor 233 serves as an output transistor.

The transistor 233 can be, for example, a transistor including a semiconductor layer in which a channel is formed and a semiconductor (such as silicon) belonging to the 14th group of the periodic table is included.

Next, an example of an operation of the memory cell in FIG. 5B is described with reference to FIG. 5C. FIG. 5C is a timing diagram of an example of an operation of the memory cell in FIG. 5B.

In writing of data, as shown in a period 251 in FIG. 5C, for example, the selection signal is input to the gate of the transistor 231 according to the pulse of the row address signal, the transistor 231 is turned on according to the selection signal, and the data signal is input to the memory cell according to the pulse of the column address signal. The voltage of the node N41 is thus set to a value corresponding to the data signal, whereby the memory cell is brought into a state where data is written (such a state is also referred to as a state WRT).

Note that the pulse width of the row address signal is different from that of the column address signal, and thus the row address signal starts to change after the column address signal starts to change. Consequently, the data signal for writing data to the memory cell to be selected can be set before the memory cell is selected.

After that, in reading of the written data, as shown in a period 252 in FIG. 5C, for example, the voltage of the node N41 is changed according to the pulse of the read signal. Further, the transistor 233 is placed in an on state or off state depending on the changed voltage of the node N41, and the voltage of the other of the source and the drain of the transistor 233 is read out as a data signal. The memory cell is thus brought into a state where data is read out (such a state is also referred to as a state RD). The above is an example of an operation of the memory cell in FIG. 5B.

As is described with reference to FIGS. 5A to 5C, an example of the memory circuit in this embodiment has a structure where one of the pulse width of the row address signal and that of the column address signal is changed by the pulse converter circuit. With the above structure, the area of the circuit can be reduced. Further, with the above structure, the column address signal can be changed before the row address signal is changed. This is effective in preventing an operation failure; for example, undesired data can be prevented from being written into the memory cell.
(Embodiment 4)

In this embodiment, as an example of a semiconductor device including the memory circuit in Embodiment 3, a semiconductor device which can wirelessly communicate data will be described.

Figure 6:
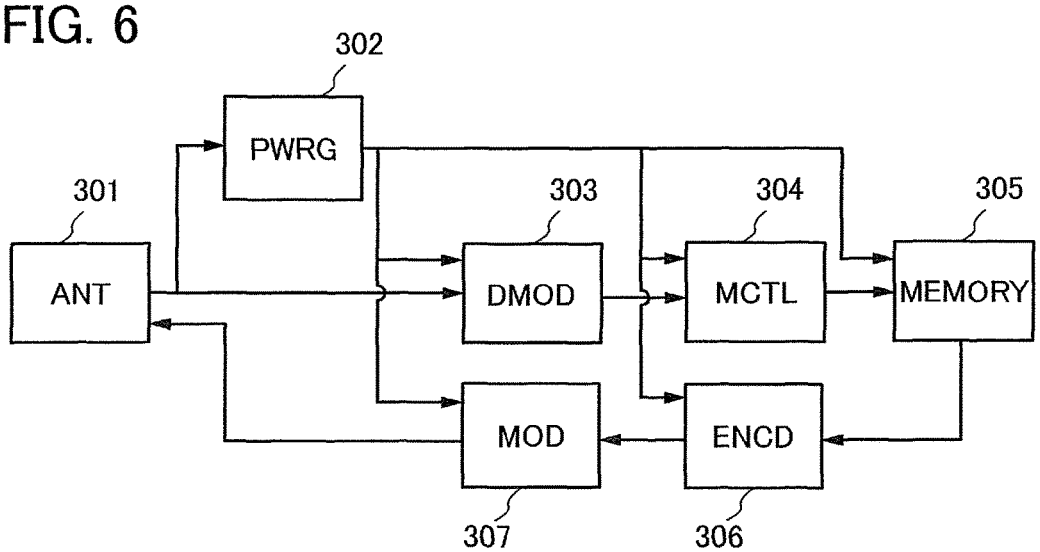
FIG. 6 is a block diagram illustrating an example of a structure of a semiconductor device in Embodiment 4.

An example of a structure of the semiconductor device in this embodiment will be described with reference to FIG. 6. FIG. 6 is a block diagram showing an example of a structure of the semiconductor device in this embodiment.

The semiconductor device in FIG. 6 includes an antenna circuit (also referred to as ANT) 301, a power supply circuit (also referred to as PWRG) 302, a demodulation circuit (also referred to as DMOD) 303, a memory control circuit (also referred to as MCTL) 304, a memory circuit (also referred to as MEMORY) 305, an encoding circuit (also referred to as ENCD) 306, and a modulation circuit (also referred to as MOD) 307. The semiconductor device in FIG. 6 transmits and receives radio signals to and from an external circuit such as a wireless communication device (a device capable of wireless communication, such as a reader/writer or an interrogator) via the antenna circuit 301.

The antenna circuit 301 has a function of transmitting and receiving a carrier wave.

The power supply circuit 302 has a function of generating a power supply voltage using a voltage according to the carrier wave received by the antenna circuit 301.

The demodulation circuit 303 has a function of demodulating the carrier wave received by the antenna circuit 301 to extract a data signal.

The memory control circuit 304 has a function of generating an access signal such as a write control signal, a read control signal, and an address signal on the basis of the demodulated data signal.

The memory circuit 305 stores data. For example, one or both of read only memory (ROM) and random access memory (RAM) can be used as the memory circuit 305.

The encoding circuit 306 has a function of encoding the data signal read out from the memory circuit 305.

The modulation circuit 307 has a function of modulating the encoded data signal and generating a data signal to be transmitted as a carrier wave from the antenna circuit 301.

Next, an example of an operation of the semiconductor device in FIG. 6 will be described.

When the antenna circuit 301 receives a carrier wave, a voltage is generated according to the carrier wave received by the antenna circuit 301.

The voltage generated by the antenna circuit 301 is input to the power supply circuit 302 and the demodulation circuit 303.

The power supply circuit 302 generates a power supply voltage based on the voltage generated by the antenna circuit 301 and outputs the generated power supply voltage to the demodulation circuit 303, the memory control circuit 304, the memory circuit 305, the encoding circuit 306, and the modulation circuit 307.

The demodulation circuit 303 demodulates the signal of the voltage input from the antenna circuit 301 to extract a data signal, and outputs the extracted data signal to the memory control circuit 304.

The memory control circuit 304 generates an access signal according to the data signal.

The memory circuit 305 writes or reads data according to the access signal.

The encoding circuit 306 encodes a data signal read out from the memory circuit 305.

The modulation circuit 307 modulates a carrier wave to be transmitted from the antenna circuit 301 according to the encoded data signal. The above is an example of an operation of the semiconductor device in FIG. 6.

As described with reference to FIG. 6, the semiconductor device in this embodiment can wirelessly transmit and receive data. By using the memory circuit in the above embodiment in this semiconductor device, a highly reliable semiconductor device with a small circuit area can be provided.

(Embodiment 5)

In this embodiment, a transistor which can be used as the transistor including an oxide semiconductor layer included in the pulse converter circuit, the memory circuit, or the semiconductor device in the above embodiments will be described.

A transistor including an oxide semiconductor layer in this embodiment includes an oxide semiconductor layer which is purified to be intrinsic (or i-type) or substantially intrinsic. Note that purification includes at least one of the following: removal of hydrogen from the oxide semiconductor layer as much as possible, and supply of oxygen to the oxide semiconductor layer in order to reduce defects due to oxygen vacancies in the oxide semiconductor layer.

An example of a structure of the transistor in this embodiment will be described with reference to FIGS. 7A to 7D.

FIGS. 7A to 7D are schematic cross-sectional views each illustrating an example of a structure of the transistor in this embodiment.

Figure 7A:
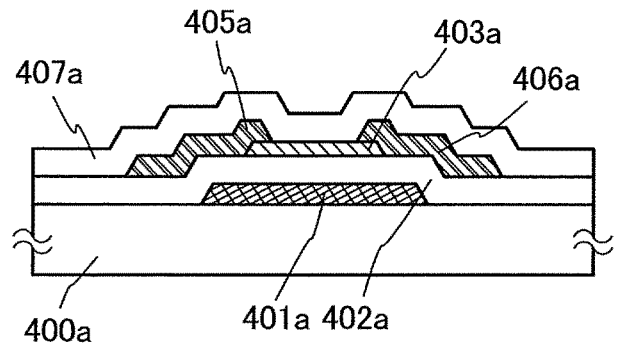
FIGS. 7A to 7D are schematic cross-sectional views each illustrating an example of a structure of a transistor in Embodiment 5.

The transistor in FIG. 7A is a bottom-gate transistor which is also called an inverted staggered transistor.

The transistor in FIG. 7A includes a conductive layer 401a, an insulating layer 402a, an oxide semiconductor layer 403a, a conductive layer 405a, and a conductive layer 406a.

The conductive layer 401a is formed over a substrate 400a, the insulating layer 402a is formed over the conductive layer 401a, the oxide semiconductor layer 403a is formed over the conductive layer 401a with the insulating layer 402a interposed therebetween, and the conductive layer 405a and the conductive layer 406a are each formed over part of the oxide semiconductor layer 403a.

Further, in the transistor in FIG. 7A, an oxide insulating layer 407a is in contact with part of an upper surface of the oxide semiconductor layer 403a (part of the oxide semiconductor layer 403a over which neither the conductive layer 405a nor the conductive layer 406a is provided).

Figure 7B:
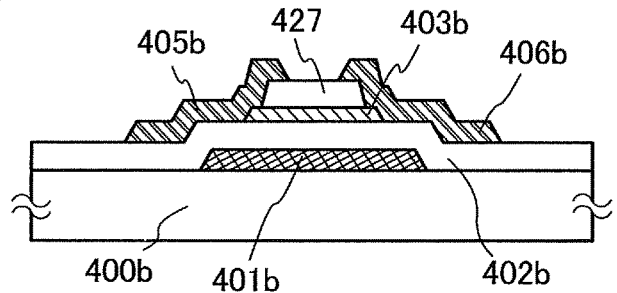

The transistor in FIG. 7B is a channel protective (also referred to as a channel stop) transistor which is one of the bottom-gate transistors, and is also referred to as an inverted staggered transistor.

The transistor in FIG. 7B includes a conductive layer 401b, an insulating layer 402b, an oxide semiconductor layer 403b, an insulating layer 427, a conductive layer 405b, and a conductive layer 406b.

The conductive layer 401b is formed over a substrate 400b, the insulating layer 402b is formed over the conductive layer 401b, the oxide semiconductor layer 403b is formed over the conductive layer 401b with the insulating layer 402b interposed therebetween, the insulating layer 427 is formed over the conductive layer 401b with the insulating layer 402b and the oxide semiconductor layer 403b interposed therebetween, and the conductive layer 405b and the conductive layer 406b are formed over part of the oxide semiconductor layer 403b with the insulating layer 427 interposed therebetween. The conductive layer 401b can overlap with the whole oxide semiconductor layer 403b. When the conductive layer 401b overlaps with the whole oxide semiconductor layer 403b, light can be prevented from entering the oxide semiconductor layer 403b. The structure is not limited to this; the conductive layer 401b can overlap with part of the oxide semiconductor layer 403b.

Figure 7C:
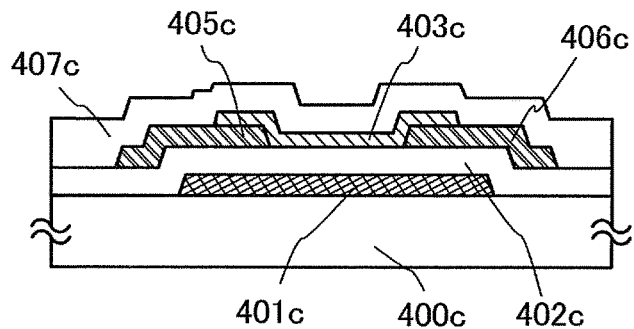

A transistor shown in FIG. 7C is a bottom-gate transistor.

The transistor in FIG. 7C includes a conductive layer 401c, an insulating layer 402c, an oxide semiconductor layer 403c, a conductive layer 405c, and a conductive layer 406c.

The conductive layer 401c is formed over a substrate 400c, the insulating layer 402c is formed over the conductive layer 401c, the conductive layer 405c and the conductive layer 406c are formed over part of the insulating layer 402c, and the oxide semiconductor layer 403c is formed over the conductive layer 401c with the insulating layer 402c, the conductive layer 405c, and the conductive layer 406c interposed therebetween. The conductive layer 401c can overlap with the whole oxide semiconductor layer 403c. When the conductive layer 401c overlaps with the whole oxide semiconductor layer 403c, light can be prevented from entering the oxide semiconductor layer 403c. The structure is not limited to this; the conductive layer 401c can overlap with part of the oxide semiconductor layer 403c.

In the transistor shown in FIG. 7C, an oxide insulating layer 407c is in contact with an upper surface and a side surface of the oxide semiconductor layer 403c.

Note that a protective insulating layer may be provided over the oxide insulating layer in FIGS. 7A to 7C.

Figure 7D:
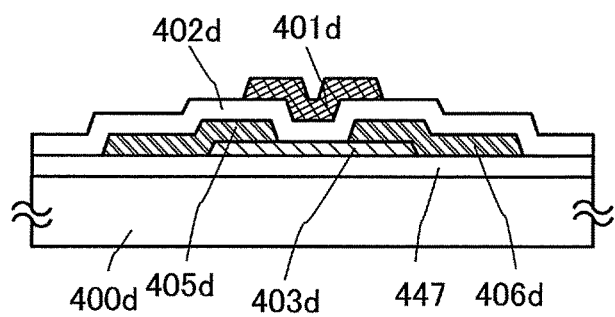

A transistor shown in FIG. 7D is a top-gate transistor.

The transistor in FIG. 7D includes a conductive layer 401d, an insulating layer 402d, an oxide semiconductor layer 403d, a conductive layer 405d, and a conductive layer 406d.

The oxide semiconductor layer 403d is formed over a substrate 400d with an insulating layer 447 interposed therebetween, the conductive layer 405d and the conductive layer 406d are each formed over part of the oxide semiconductor layer 403d, the insulating layer 402d is formed over the oxide semiconductor layer 403d, the conductive layer 405d, and the conductive layer 406d, and the conductive layer 401d is formed over the oxide semiconductor layer 403d with the insulating layer 402d interposed therebetween.

As the substrates 400a to 400d, a glass substrate of barium borosilicate glass, aluminoborosilicate glass, or the like can be used, for example.

Alternatively, a substrate formed of an insulator, such as a ceramic substrate, a quartz substrate, or a sapphire substrate can be used as the substrates 400a to 400d. Further alternatively, crystallized glass or a plastic substrate can be used as the substrates 400a to 400d. Still further alternatively, a semiconductor substrate formed of silicon or the like can be used as the substrates 400a to 400d.

The insulating layer 447 in FIG. 7D serves as a base layer preventing diffusion of an impurity element from the substrate 400d. The insulating layer 447 can be, for example, a silicon nitride layer, a silicon oxide layer, a silicon nitride oxide layer, a silicon oxynitride layer, an aluminum oxide layer, or an aluminum oxynitride layer. Alternatively, the insulating layer 447 can be a stack of layers each formed of materials that can be used for the insulating layer 447. Alternatively, the insulating layer 447 can be a stack including a layer formed of a light-blocking material and a layer formed of a material that can be used for the insulating layer 447. When the insulating layer 447 includes a layer formed of a light-blocking material, light can be prevented from entering the oxide semiconductor layer 403d.

Note that in each of the transistors in FIGS. 7A to 7C, an insulating layer may be provided between the substrate and the conductive layer serving as a gate electrode, as in the transistor in FIG. 7D.

Next, components of the transistors in FIGS. 7A to 7D are described below.

Each of the conductive layers 401a to 401d serves as a gate electrode of the transistor. Each of the conductive layers 401a to 401d can be, for example, a layer of a metal material such as molybdenum, titanium, chromium, tantalum, tungsten, aluminum, copper, neodymium, or scandium; or a layer of an alloy material containing any of these materials as a main component. The conductive layers 401a to 401d can be a stack of layers each formed of a material that can be used for the conductive layers 401a to 401d.

Each of the insulating layers 402a to 402d serves as a gate insulating layer of the transistor. Each of the insulating layers 402a to 402d can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer. Alternatively, each of the insulating layers 402a to 402d can be a stack of layers each formed of a material that can be used for the insulating layers 402a to 402d. The layer formed of a material that can be used for the insulating layers 402a to 402d can be formed by a plasma CVD method, a sputtering method, or the like. For example, the insulating layers 402a to 402d can be formed by forming a silicon nitride layer by a plasma CVD method and then forming a silicon oxide layer thereover by a plasma CVD method.

Each of the oxide semiconductor layers 403a to 403d serves as a channel formation layer of the transistor. Examples of an oxide semiconductor that can be used for the oxide semiconductor layers 403a to 403d include a four-component metal oxide, a three-component metal oxide, and a two-component metal oxide. As the four-component metal oxide, an In—Sn—Ga—Zn—O-based metal oxide can be used, for example. As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide can be used, for example. As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Sn—O-based metal oxide can be used, for example. In addition, an In—O-based metal oxide, a Sn—O-based metal oxide, a Zn—O-based metal oxide, or the like can be used as the oxide semiconductor. The metal oxide that can be used as the oxide semiconductor may contain $SiO_2$.

In the case of using an In—Zn—O-based metal oxide, for example, an oxide target having the following composition ratios can be used for deposition of an In—Zn—O-based metal oxide semiconductor layer: In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, when the atomic ratio of the target used for the deposition of the In—Zn—O-based oxide semiconductor is expressed by In:Zn:O=P:Q:R, R>1.5P+Q. An increase in the In content enables the mobility of the transistor to increase.

Further, a material represented by $InMO_3(ZnO)_m$ (m is larger than 0) can be used as the oxide semiconductor. Here, M represents one or more metal elements selected from Ga, Al, Mn, and Co. For example, M can be Ga, Ga and Al, Ga and Mn, or Ga and Co.

Each of the conductive layers 405a to 405d and the conductive layers 406a to 406d serves as a source electrode or a drain electrode of the transistor. Each of the conductive layers 405a to 405d and the conductive layers 406a to 406d can be, for example, a layer of a metal material such as aluminum, chromium, copper, tantalum, titanium, molybdenum, or tungsten; or a layer of an alloy material containing any of these metal materials as a main component. The conductive layers 405a to 405d and the conductive layers 406a to 406d can be a stack of layers each formed of a material that can be used for the conductive layers 405a to 405d and the conductive layers 406a to 406d.

For example, the conductive layers 405a to 405d and the conductive layers 406a to 406d can be formed by stacking a metal layer of aluminum or copper and a refractory metal layer of titanium, molybdenum, tungsten, or the like. Alternatively, the conductive layers 405a to 405d and the conductive layers 406a to 406d can be formed using a stack including a metal layer of aluminum or copper between refractory metal layers. Further, when the conductive layers 405a to 405d and the conductive layers 406a to 406d are formed using an aluminum layer to which an element that prevents generation of hillocks or whiskers (e.g., Si, Nd, or Sc) is added, heat resistance can be increased.

Alternatively, each of the conductive layers 405a to 405d and the conductive layers 406a to 406d can be a layer containing a conductive metal oxide. Examples of the conductive metal oxide that can be used include indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or such a metal oxide material containing silicon oxide.

Further, another wiring may also be formed using the material used for forming the conductive layers 405a to 405d and the conductive layers 406a to 406d.

The insulating layer 427 serves as a layer protecting a channel formation layer (also referred to as a channel protective layer) of the transistor. The insulating layer 427 can be, for example, a layer formed of a material that can be used for the insulating layer 447. Alternatively, the insulating layer 427 can be a stack of layers each formed of a material that can be used for the insulating layer 427.

The oxide insulating layers 407a and 407c can be an oxide insulating layer e.g., a silicon oxide layer. The oxide insulating layers 407a 407c can be a stack of layers each formed of a material that can be used for the oxide insulating layers 407a and 407c.

Next, as an example of a method for manufacturing the transistor in this embodiment, an example of a method for manufacturing the transistor illustrated in FIG. 7A will be described with reference to FIGS. 8A to 8D. FIGS. 8A to 8D are schematic cross-sectional views illustrating an example of a method for manufacturing the transistor in FIG. 7A.

First, the substrate 400a is prepared and a first conductive film is formed thereover. The first conductive film is selectively etched to form the conductive layer 401a (see FIG. 8A).

For example, a first resist mask is formed over part of the first conductive film by a first photolithography step and the first conductive film is etched using the first resist mask to form the conductive layer 401a. Note that the first resist mask is removed after the conductive layer 401a is formed.

For example, the first conductive film can be formed using a material that can be used for the conductive layer 401a. The first conductive film can be formed by stacking layers each formed of a material that can be used for the first conductive film.

Note that the resist mask may be formed by an ink jetting method. A photomask is not used in an inkjet method; thus, manufacturing cost can be reduced. Further, the resist mask may be formed using a multi-tone mask. A multi-tone mask is a mask through which light is transmitted to have a plurality of intensities. When a multi-tone mask is used, a resist mask having portions with different thicknesses can be formed and such a resist mask can be used in successive etching steps; therefore, manufacturing cost can be reduced.

Then, a first insulating film is formed over the conductive layer 401a to form the insulating layer 402a. An oxide semiconductor film is formed over the insulating layer 402a, and then the oxide semiconductor film is etched and subjected to a first heat treatment, whereby the oxide semiconductor layer 403a is formed (see FIG. 8B).

For example, the first insulating film can be formed by a sputtering method, a plasma CVD method, or the like. For example, when the first insulating film is formed by a high-density plasma CVD method (e.g., a high-density plasma CVD method using microwaves at a frequency of 2.45 GHz), the insulating layer 402a can be dense and thereby has an improved breakdown voltage.

Further, the first insulating film can be formed using a material that can be used for the insulating layer 402a. The first insulating film can be formed by stacking layers each formed of a material that can be used for the first insulating film.

The oxide semiconductor film can be formed by a sputtering method. Note that the oxide semiconductor film may be formed in a rare gas atmosphere, an oxygen atmosphere, or in a mixed atmosphere of a rare gas and oxygen.

The oxide semiconductor film can be formed using an oxide semiconductor material that can be used for the oxide semiconductor layer 403a.

For the formation of the oxide semiconductor film, an oxide target having a composition ratio: $In_2O_3$:$Ga_2O_3$:ZnO=1:1:1 or $In_2O_3$:$Ga_2O_3$:ZnO=1:1:2 in molar ratio can be used. In the oxide target that is used, the proportion of the volume of a portion except for an area occupied by a space and the like with respect to the total volume (the proportion is also referred to as the filling factor) is preferably higher than or equal to 90% and lower than or equal to 100%, more preferably higher than or equal to 95% and lower than or equal to 99.9%. With a target having a high filling factor, a dense oxide semiconductor film can be formed.

Further, as a sputtering gas used for forming the oxide semiconductor film, for example, a high-purity gas from which impurities such as hydrogen, water, hydroxyl, or hydride are removed is preferably used.

Before the formation of the oxide semiconductor film, pre-heating may be performed. By pre-heating, impurities such as hydrogen or moisture are released from the insulating layer 402a and the oxide semiconductor film. Note that in the case of performing pre-heating in a pre-heating chamber, a cryopump is preferably provided as an exhaustion means in the pre-heating chamber, for example.

Further, the oxide semiconductor film may be formed while the substrate 400a is placed under reduced pressure and the temperature of the substrate 400a is set higher than or equal to 100° C. and lower than or equal to 600° C., preferably higher than or equal to 200° C. and lower than or equal to 400° C. By heating the substrate 400a, the concentration of impurities in the oxide semiconductor film can be reduced and damage to the oxide semiconductor film during the sputtering can be reduced.

Further, moisture remaining in a deposition chamber where the oxide semiconductor film is formed can be removed with an entrapment vacuum pump or the like, for example. As the entrapment vacuum pump, a cryopump, an ion pump, or a titanium sublimation pump can be used, for example. Further, a turbo pump provided with a cold trap can be used to remove moisture remaining in the deposition chamber.

Before the formation of the oxide semiconductor film, reverse sputtering is preferably performed to remove powdery substances (also referred to as particles or dust) attached on a surface of the insulating layer 402a. The reverse sputtering refers to a method in which, while a voltage is not applied to a target side, an RF power source is used for applying a voltage to a substrate side in an argon, nitrogen, helium, or oxygen atmosphere so that plasma is generated to modify a surface of the substrate.

The oxide semiconductor film can be etched using a second resist mask which is formed over part of the oxide semiconductor film by a second photolithography step, for example. Note that the second resist mask is removed after the oxide semiconductor film is etched.

Dry etching, wet etching, or both dry etching and wet etching can be employed for etching the oxide semiconductor film, for example. The oxide semiconductor film can be etched, for example, using a mixed solution of phosphoric acid, acetic acid, and nitric acid as an etchant. ITO07N (produced by Kanto Chemical Co., Inc.) may be used as an etchant for etching the oxide semiconductor film.

In addition, the first heat treatment is performed at higher than or equal to 400° C. and lower than or equal to 750° C., or higher than or equal to 400° C. and lower than the strain point of the substrate, for example. Through the first heat treatment, dehydration or dehydrogenation can be performed.

A heat treatment apparatus for the heat treatment may be an electric furnace or an apparatus for heating an object by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating the object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp, for example. A GRTA apparatus is an apparatus for heat treatment using a high-temperature gas. As the high-temperature gas, a rare gas or an inert gas (e.g., nitrogen) which does not react with the object by the heat treatment can be used.

For example, as the first heat treatment, GRTA which includes heating for several minutes in an inert gas heated to 650° C. to 700° C. may be employed.

Note that it is preferable that water, hydrogen, and the like be not contained in a gas used in the first heat treatment. It is preferable that the gas have a purity of 6N (99.9999%) or more, preferably, 7N (99.99999%) or more, that is, it is preferable that the impurity concentration be lower than or equal to 1 ppm, more preferably, lower than or equal to 0.1 ppm.

After the oxide semiconductor layer is heated in the first heat treatment, a high-purity oxygen gas, a high-purity $N_2O$ gas, or ultra-dry air (having a dew point of lower than or equal to −40° C., preferably lower than or equal to −60° C.) may be introduced into the same furnace while the heating temperature is being maintained or being decreased. It is preferable that the oxygen gas or the $N_2O$ gas do not contain water, hydrogen, and the like. The purity of the oxygen gas or the $N_2O$ gas which is introduced into the heat treatment apparatus is preferably equal to or more than 6N, more preferably equal to or more than 7N, that is, the impurity concentration of the oxygen gas or the $N_2O$ gas is preferably equal to or lower than 1 ppm, more preferably equal to or lower than 0.1 ppm. The oxygen gas or the $N_2O$ gas which are introduced supplies oxygen to the oxide semiconductor layer 403a, whereby the oxide semiconductor layer 403a can be purified.

Note that the first heat treatment may be performed after the oxide semiconductor film is formed and etched. Alternatively, the oxide semiconductor film may be etched after the oxide semiconductor film is formed and the first heat treatment is performed.

In addition to the above timings, the first heat treatment may be performed after the conductive layers 405a and 406a are formed over the oxide semiconductor layer 403a or after the oxide insulating layer 407a is formed over the conductive layers 405a and 406a, as long as the first heat treatment is performed after the formation of the oxide semiconductor layer.

Alternatively, the oxide semiconductor film may be formed by two deposition steps and heat treatment may be performed after each deposition step so that the resulting oxide semiconductor film may include a crystalline region with the c-axis oriented perpendicularly to the film surface. For example, a first oxide semiconductor film with a thickness of equal to or greater than 3 nm and equal to or less than 15 nm is formed and subjected to first heat treatment at a temperature of equal to or higher than 450° C. and equal to or lower than 850° C., preferably equal to or higher than 550° C. and equal to or lower than 750° C. in an atmosphere of nitrogen, oxygen, a rare gas, or dry air, so that the first oxide semiconductor film includes a crystalline region (including a plate-like crystal) in a region including a surface; then, a second oxide semiconductor film which is thicker than the first oxide semiconductor film is formed and subjected to a second heat treatment at a temperature equal to or higher than 450° C. and equal to or lower than 850° C., preferably equal to or higher than 600° C. and equal to or lower than 700° C., so that crystals grow upward from the first oxide semiconductor film into the second oxide semiconductor film using the first oxide semiconductor film as a seed of crystal growth, whereby the whole of the second oxide semiconductor film is crystallized. In such a manner, the oxide semiconductor film including a crystalline region with the c-axis oriented perpendicularly to the film surface can be formed. The oxide semiconductor film thus formed is thicker than a single-layer oxide semiconductor film formed.

Figure 8A:
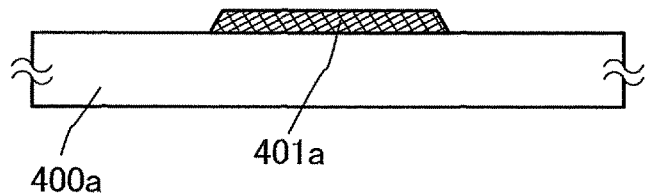
FIGS. 8A to 8D are schematic cross-sectional views illustrating a method for manufacturing the transistor in FIG. 7A.
Figure 8B:
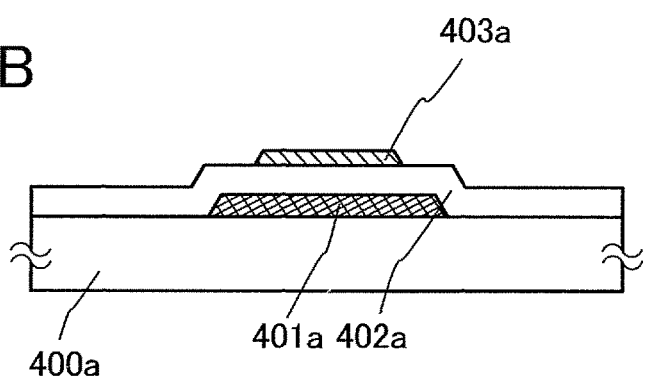
Figure 8C:
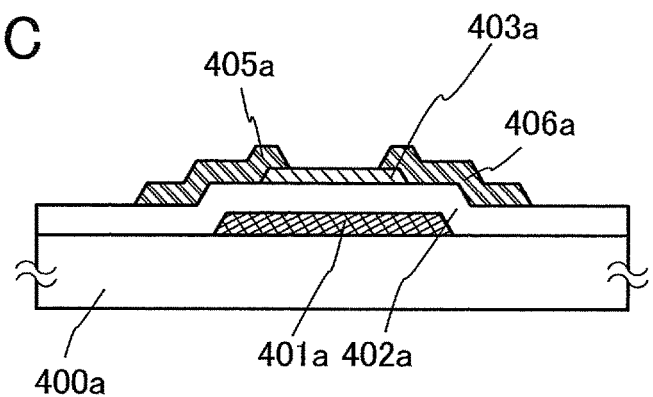

Then, a second conductive film is formed over the insulating layer 402a and the oxide semiconductor layer 403a and selectively etched to form the conductive layers 405a and 406a (see FIG. 8C).

For example, a third resist mask is formed over part of the second conductive film by a third photolithography step and the second conductive film is etched using the third resist mask to form the conductive layers 405a and 406a. Note that the third resist mask is removed after the conductive layers 405a and 406a are formed.

Further, the second conductive film can be formed using a material that can be used for the conductive layers 405a and 406a. The second conductive film can be formed by stacking layers each formed of a material that can be used for the second conductive film.

The second conductive film can be, for example, a film of a metal material such as aluminum, chromium, copper, tantalum, titanium, molybdenum, or tungsten; or a film of an alloy material containing any of these metal materials as a main component. The second conductive film can be a stack of films formed by stacking films that can be used as the second conductive film.

Note that the third resist mask is preferably formed by light exposure to ultraviolet rays, KrF laser light, or ArF laser light. A channel length L of the resulting transistor depends on the width of the interval between bottom ends of the conductive layers 405a and 406a which are adjacent to each other over the oxide semiconductor layer 403a. In the case where light exposure is performed to form the third resist mask which makes the channel length L less than 25 nm, the light exposure is preferably performed using extreme ultraviolet rays having an extremely short wavelength of several nanometers to several tens of nanometers. In the light exposure by extreme ultraviolet light, the resolution is high and the focus depth is large. Accordingly, the channel length L of the resulting transistor can be equal to or greater than 10 nm and equal to or less than 1000 nm.

After the conductive layers 405a and 406a are formed, pre-heating may be performed. This pre-heating may be performed similarly to the above one.

Then, the oxide insulating layer 407a is formed to be in contact with the oxide semiconductor layer 403a.

For example, the oxide insulating layer 407a can be formed by forming a second insulating film over the oxide semiconductor layer 403a, the conductive layer 405a, and the conductive layer 406a in a rare gas (typically, argon) atmosphere, an oxygen atmosphere, or a mixed atmosphere of a rare gas and oxygen, by a method (e.g., a sputtering method) in which impurities such as water or hydrogen do not enter the oxide insulating layer 407a. By forming the oxide insulating layer 407a in which impurities such as water or hydrogen do not enter the oxide insulating layer 407a, reduction in resistance of a back channel of the oxide semiconductor layer can be prevented. The temperature of the substrate in the formation of the oxide insulating layer 407a is preferably equal to or higher than room temperature and equal to or lower than 300° C.

The second insulating film may be formed using a silicon oxide target or a silicon target, for example. For example, with use of a silicon target, a silicon oxide film can be formed as the second insulating film by a sputtering method in an atmosphere containing oxygen.

Further, as a sputtering gas used for forming the second insulating film, for example, a high-purity gas from which impurities such as hydrogen, water, hydroxyl, or hydride are removed is preferably used.

Before the formation of the oxide insulating layer 407a, plasma treatment using a gas such as $N_2O$, $N_2$, or Ar may be performed to remove water or the like adsorbed on an exposed surface of the oxide semiconductor layer 403a. In the case of performing the plasma treatment, the oxide insulating layer 407a is preferably formed after the plasma treatment without exposure to air.

Further, after the oxide insulating layer 407a is formed, a second heat treatment (preferably at equal to or higher than 200° C. and equal to or lower than 400° C., e.g., equal to or higher than 250° C. and equal to or lower than 350° C.) may be performed in an inert gas atmosphere or an oxygen gas atmosphere. For example, the second heat treatment is performed at 250° C. in a nitrogen atmosphere for one hour. By the second heat treatment, heat is applied while part of the upper surface of the oxide semiconductor layer 403a is in contact with the oxide insulating layer 407a.

Through the above process, impurities such as hydrogen, moisture, hydroxyl, or hydride (also referred to as a hydrogen compound) can be intentionally removed from the oxide semiconductor layer, and in addition, oxygen can be supplied to the oxide semiconductor layer. Thus, the oxide semiconductor layer is purified.

Figure 8D:
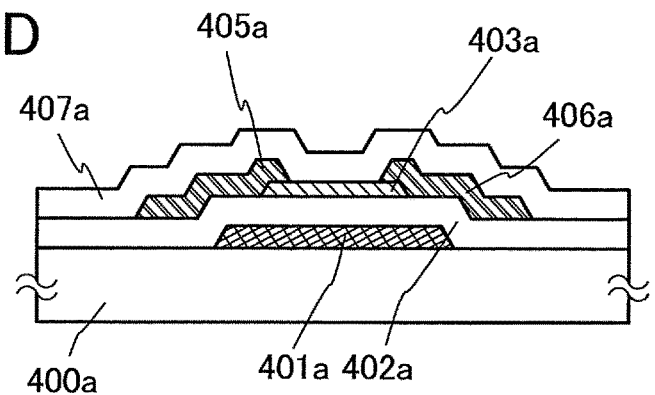

Through the above process, the transistor is formed (see FIG. 8D).

When the oxide insulating layer 407a is a silicon oxide layer having many defects, impurities such as hydrogen, moisture, hydroxyl, or hydride in the oxide semiconductor layer 403a is diffused into the oxide insulating layer 407a by the second heat treatment performed after the formation of the silicon oxide layer, whereby the impurities in the oxide semiconductor layer 403a can be further reduced.

A protective insulating layer may be formed over the oxide insulating layer 407a. The protective insulating layer is provided by forming an insulating film by an RF sputtering method, for example. An RF sputtering method is preferable as a formation method of the protective insulating layer because it provides high mass productivity. The above is an example of a method for manufacturing the transistor in FIG. 7A.

Note that the method for manicuring the transistor in this embodiment may include an oxygen doping treatment using oxygen plasma. For example, an oxygen doping treatment using a high-density plasma of 2.45 GHz may be performed. Note that the oxygen doping treatment may be performed after the formation of the insulating layer serving as a gate insulating layer, after the formation of the oxide semiconductor film, after the first heat treatment, after the formation of the conductive layer serving as a source electrode or a drain electrode, or after the formation of the oxide insulating layer. By the oxygen doping treatment, variation in electrical characteristics of the transistors which are manufactured can be reduced.

Note that the given example of the method for manufacturing the transistor is not necessarily applied only to the transistor in FIG. 7A. For example, the above description of the example of the method for manufacturing the transistor in FIG. 7A can be applied as appropriate to the components of FIGS. 7B to 7D which have the same designations as the components of FIG. 7A and have a function at least partly the same as that of the components of FIG. 7A.

As is described with reference to FIGS. 7A to 7D and FIGS. 8A to 8D, the transistor in this embodiment has a structure including a first conductive layer serving as a gate electrode; an insulating layer serving as a gate insulating layer; an oxide semiconductor layer in which a channel is formed and which overlaps with first conductive layer with the insulating layer interposed therebetween; a second conductive layer which is electrically connected to the oxide semiconductor layer and serves as one of a source electrode and a drain electrode; and a third conductive layer which is electrically connected to the oxide semiconductor layer and serves as the other of the source electrode and the drain electrode. The oxide semiconductor layer is in contact with an oxide insulating layer.

The oxide semiconductor layer in which a channel is formed is an oxide semiconductor layer which is made to be i-type or substantially i-type by purification. By purification of the oxide semiconductor layer, the carrier concentration of the oxide semiconductor layer can be lower than $1 \times 10^{14}/cm^3$, preferably lower than $1 \times 10^{12}/cm^3$, further preferably lower than $1 \times 10^{11}/cm^3$, and thus, change in characteristics due to temperature change can be suppressed. With the above structure, the off-state current per micrometer of the channel width can be equal to or less than 10 aA ($1 \times 10^{-17}$ A), equal to or less than 1 aA ($1 \times 10^{-18}$ A), equal to or less than 10 zA ($1 \times 10^{-20}$ A), further equal to or less than 1 zA ($1 \times 10^{-21}$ A), and further more equal to or less than 100 yA ($1 \times 10^{-22}$ A). It is preferable that the off-state current of the transistor be as small as possible. The smallest value of the off-state current of the transistor in this embodiment is estimated to be about $10^{-30}$ A/μm.

Further, measured values of an off-state current in an element for characteristic evaluation will be described below.

Figure 9:
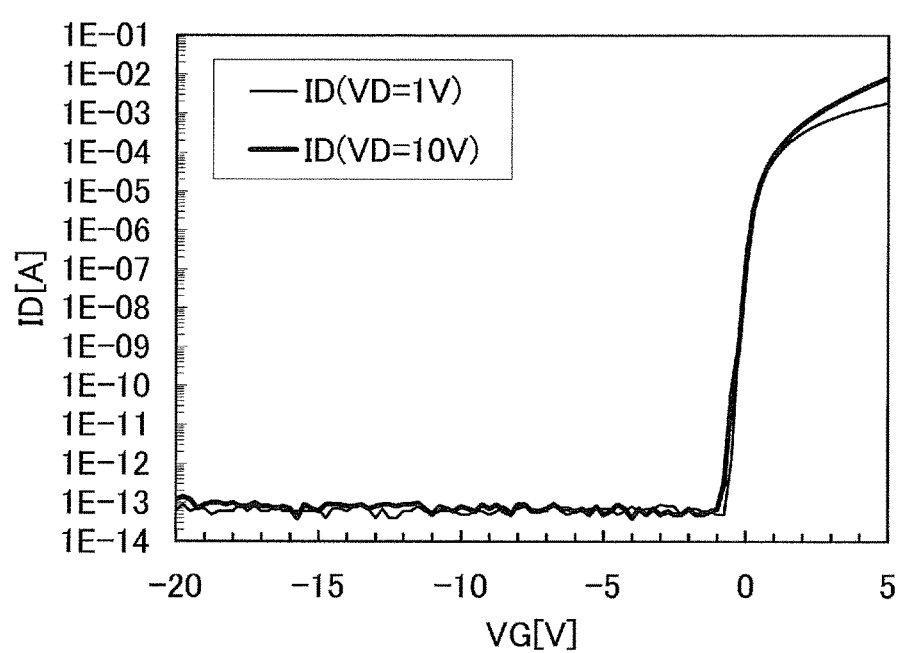
FIG. 9 shows initial characteristics of a transistor.

A transistor in which L/W=3 μm/10000 μm was used as the element for characteristic evaluation. The initial characteristic of the transistor (the relation between a voltage between a gate and a source (also referred to as a voltage VG) and a current between the source and a drain (a current ID)) is shown in FIG. 9. Note that in the measurement, the temperature of the substrate was room temperature, a voltage between the source and the drain (hereinafter, referred to as a drain voltage or a voltage VD) was 1 V or 10 V, and a voltage between the gate and the source was −20 V to +20 V.

As shown in FIG. 9, the transistor in which L/W=3 µm/10000 µm is an enhancement mode transistor and has an off-state current of equal to or less than $1 \times 10^{-13}$ A when the drain voltage is 1V or 10V. This off-state current is equal to or smaller than the resolution (100 fA) of the analyzer (a semiconductor parameter analyzer, Agilent 4156C manufactured by Agilent Technologies Inc.).

An example of calculation of the off-state current of the transistor in this embodiment based on the leakage current measured with use of another circuit for characteristic evaluation will be described.

Figure 10:
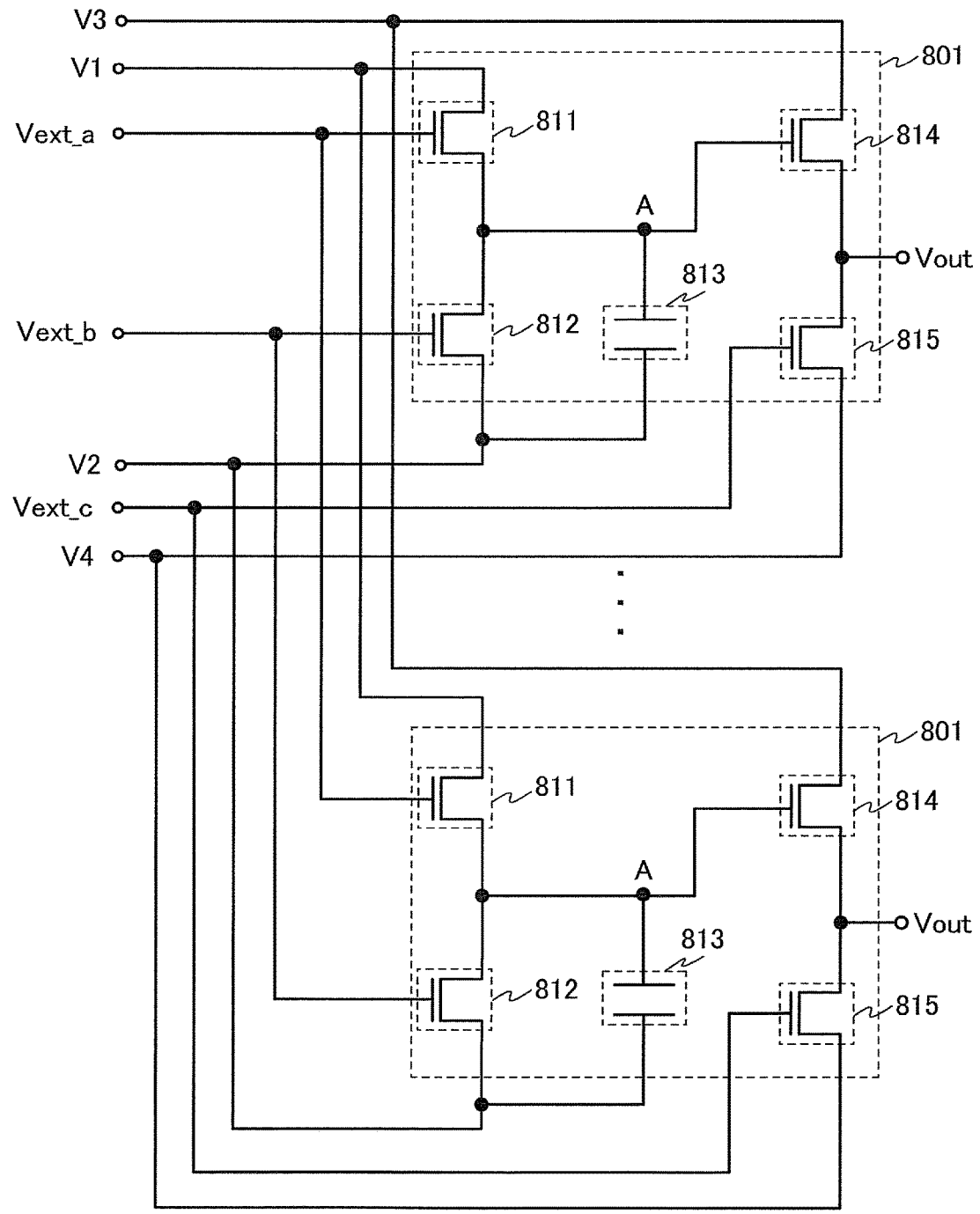
FIG. 10 is a circuit diagram showing a structure of a circuit for characteristic evaluation.

A structure of the circuit for characteristic evaluation is described with reference to FIG. 10. FIG. 10 is a circuit diagram showing a structure of the circuit for characteristic evaluation.

The circuit for characteristic evaluation in FIG. 10 includes a plurality of measurement systems 801. The measurement systems 801 are connected in parallel. In this example, eight measurement systems 801 are connected in parallel.

The measurement system 801 includes a transistor 811, a transistor 812, a capacitor 813, a transistor 814, and a transistor 815.

A voltage V1 is input to one of a source and a drain of the transistor 811, and a voltage Vext_a is input to a gate of the transistor 811. The transistor 811 is for injecting charge.

One of a source and a drain of the transistor 812 is connected to the other of the source and the drain of the transistor 811, a voltage V2 is input to the other of the source and the drain of the transistor 812, and a voltage Vext_b is input to a gate of the transistor 812. The transistor 812 is for evaluating leakage current. Note that the leakage current here includes an off-state current of a transistor.

The first electrode of the capacitor 813 is connected to the other of the source and the drain of the transistor 811. To the second electrode of the capacitor 813, a voltage V2 is input. Here, 0 V is input as the voltage V2.

A voltage V3 is input to one of a source and a drain of the transistor 814. A gate of the transistor 814 is connected to the other of the source and the drain of the transistor 811. Note that a portion where the gate of the transistor 814, the other of the source and the drain of the transistor 811, the one of the source and the drain of the transistor 812, and the first electrode of the capacitor 813 are connected to one another is also referred to as a node A.

One of a source and a drain of the transistor 815 is connected to the other of the source and the drain of the transistor 814, a voltage V4 is input to the other of the source and the drain of the transistor 815, and a voltage Vext_c is input to a gate of the transistor 815. Note that here, 0.5 V is input as the voltage Vext_c.

The measurement system 801 outputs a voltage of a portion where the other of the source and the drain of the transistor 814 is connected to the one of the source and the drain of the transistor 815, as an output voltage Vout.

Here, a transistor having a channel length L of 10 µm and a channel width W of 10 µm and including an oxide semiconductor layer is used as an example of the transistor 811. A transistor having a channel length L of 3 µm and a channel width W of 100 µm and including an oxide semiconductor layer is used as an example of each of the transistor 814 and the transistor 815. A bottom-gate transistor including an oxide semiconductor layer in which a source and drain electrodes are on and in contact with the oxide semiconductor layer, a region where the source and drain electrodes overlap with a gate electrode is not provided, and an offset region with a width of 1 µm is provided is used as an example of the transistor 812. Provision of the offset region can reduce parasitic capacitance. Further, six conditions different in channel length L and channel width W are employed for the transistor 812 (see Table 1).

TABLE 1

|  | Channel length L [µm] | Channel width W [µm] |
| --- | --- | --- |
| Condition 1 | 1.5 | $1 \times 10^5$ |
| Condition 2 | 3 | $1 \times 10^5$ |
| Condition 3 | 10 | $1 \times 10^5$ |
| Condition 4 | 1.5 | $1 \times 10^6$ |
| Condition 5 | 3 | $1 \times 10^6$ |
| Condition 6 | 10 | $1 \times 10^6$ |

By separately providing the transistor for injecting charge and the transistor for evaluating leakage current as shown in FIG. 10, the transistor for evaluating leakage current can always be kept off when charge is injected. If the transistor for injecting charge is not provided, the transistor for evaluating leakage current needs to be turned on for injecting charge. In this case, if the transistor for evaluating leakage current requires a long time to turn into a steady off-state from an on-state, the measurement would take a long time.

In addition, by separately providing the transistor for injecting charge and the transistor for evaluating leakage current, each of these transistors can be of a proper size. Further, by making the channel width W of the transistor for evaluating leakage current larger than that of the transistor for injecting charge, the leakage current other than the leakage current of the transistor for evaluating leakage current can be made relatively small in the circuit for characteristic evaluation. As a result, the leakage current of the transistor for evaluating leakage current can be measured with a high accuracy. In addition, the transistor for evaluating leakage current does not need to be turned on when charge is injected, which prevents influence of change in voltage of the node A caused by part of the charge in the channel formation region of the transistor for evaluating leakage current flowing into the node A.

On the other hand, by making the channel width W of the transistor for injecting charge smaller than that of the transistor for evaluating leakage current, the leakage current of the transistor for injecting charge can be made relatively small. In addition, influence of change in voltage of the node A caused by part of the charge in the channel formation region of the transistor for injecting charge flowing into the node A at the time of charge injection can be small.

In addition, by connecting the measurement systems in parallel as shown in FIG. 10, the leakage current of the circuit for characteristic evaluation can be calculated with higher accuracy.

Next, a method for calculating the off-state current of an example of the transistor in this embodiment using the circuit for characteristic evaluation shown in FIG. 10 will be described.

Figure 11:
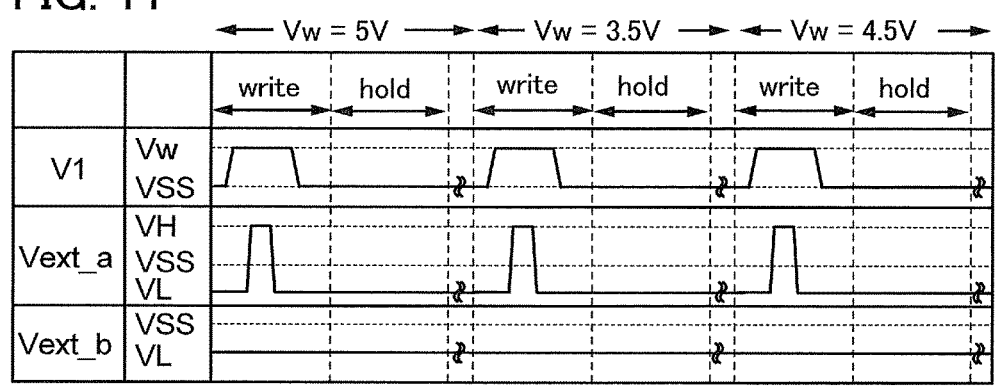
FIG. 11 is a timing diagram showing a method for measuring the leakage current of the circuit for characteristic evaluation shown in FIG. 10.

A method for measuring the leakage current of the circuit for characteristic evaluation shown in FIG. 10 will be described with referent to FIG. 11. FIG. 11 is a timing diagram for showing a method for measuring the leakage current of the circuit for characteristic evaluation shown in FIG. 10.

In the method for measuring the leakage current using the circuit for characteristic evaluation shown in FIG. 10, a write period and a hold period are provided. The operation in each period will be described below.

First, in a write period, a voltage VL (−3 V) that turns off the transistor 812 is input as the voltage Vext_b. Further, a write voltage Vw is input as the voltage V1, and then a voltage VH (5 V) that keeps the transistor 811 on for a predetermined period is input as the voltage Vext_a. Consequently, charge is accumulated in the node A, and the voltage of the node A thus becomes equivalent to the write voltage Vw. Then, the voltage VL that turns off the transistor 811 is input as the voltage Vext_a. Then, a voltage VSS (0 V) is input as the voltage V1.

In the following hold period, the amount of change in voltage of the node A, which is caused by change in amount of charge held in the node A, is measured. From the amount of change in voltage, the value of the current flowing between the source electrode and the drain electrode of the transistor 812 can be calculated. In the above described manner, the electric charge of the node A can be accumulated, and the amount of change in voltage of the node A can be measured.

In the measurement, charge is accumulated in the node A and the amount of change in voltage of the node A is measured (this operation is also referred to as accumulation and measurement operation) repeatedly. Firstly, a first accumulation and measurement operation are repeated 15 times. In the first accumulation and measurement operation, a voltage of 5 V is input as the write voltage Vw in a write period, and held for an hour in a hold period. Secondly, a second accumulation and measurement operation are repeated twice. In the second accumulation and measurement operation, a voltage of 3.5 V is input as the write voltage Vw in a write period, and held for 50 hours in a hold period. Thirdly, a third accumulation and measurement operation is performed once. In the third accumulation and measurement operation, a voltage of 4.5 V is input as the write voltage Vw in a write period, and held for 10 hours in a hold period. By repeating the accumulation and measurement operations, it can be confirmed that the measured current values are the values in the steady state. In other words, it is possible to remove a transient current (a current decreasing with time after the start of the measurement) from a current $I_A$ of the node A. As a result, leakage current can be measured with higher accuracy.

In general, the voltage $V_A$ of the node A is expressed by Formula 1 as a function of the output voltage Vout.

[Formula 1]

$$V_A = F(Vout) \quad (1)$$

In addition, the charge $Q_A$ of the node A is expressed by Formula 2 using the voltage $V_A$ of the node A, capacitance $C_A$ connected to the node A, and a constant (const). Here, the capacitance $C_A$ connected to the node A is the sum of the capacitance of the capacitor 813 and the capacitance of other elements.

[Formula 2]

$$Q_A = C_A V_A + \text{const} \quad (2)$$

The current $I_A$ of the node A is a time derivative of charge which flows into the node A (or charge which flows out of the node A), and is thus expressed by Formula 3.

[Formula 3]

$$I_A \equiv \frac{\Delta Q_A}{\Delta t} = \frac{C_A \Delta F(Vout)}{\Delta t} \quad (3)$$

Note that here, as an example, Δt is set about 54000 sec. The current $I_A$ of the node A, which is a leakage current, can be obtained from the capacitance $C_A$ connected to the node A and the output voltage Vout in the above manner; thus, the leakage current of the circuit for characteristic evaluation can be obtained.

Next, measurement results of the output voltage obtained by the measurement method using the circuit for characteristic evaluation, and the leakage current of the circuit for characteristic evaluation calculated from the measurement results will be shown.

Figure 12:
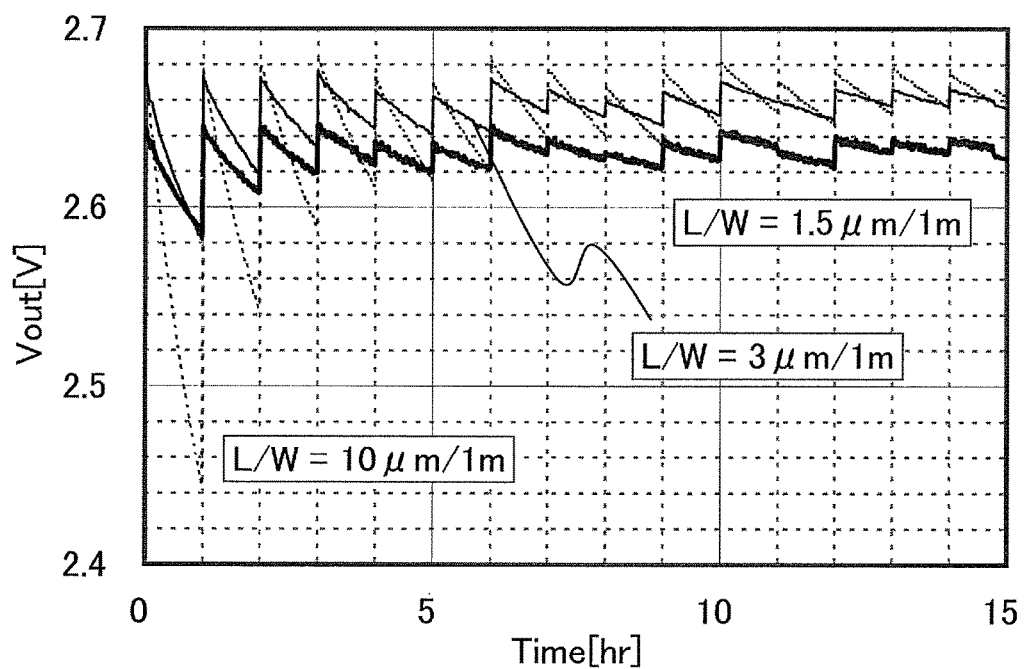
FIG. 12 is a graph showing a relation between elapsed time Time and output voltage Vout in measurement under Condition 4, Condition 5, and Condition 6.
Figure 13:
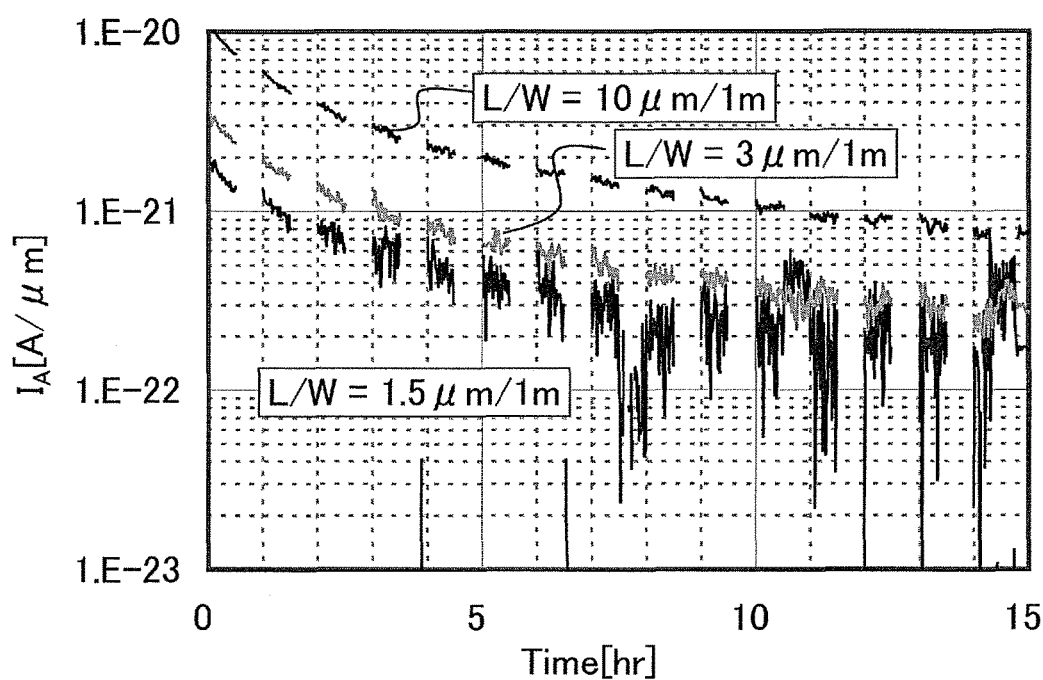
FIG. 13 is a graph showing a relation between elapsed time Time in measurement and leakage current calculated from the measurement.

FIG. 12 shows the relation between the elapsed time Time and the output voltage Vout in the measurement (the first accumulation and measurement operation) under Condition 4, Condition 5, and Condition 6. FIG. 13 shows the relation between the elapsed time Time in the measurement and the current $I_A$ calculated from the measurement. It is found that the output voltage Vout fluctuates after the measurement starts and that it takes 10 hours or longer to be in a steady state.

Figure 14:
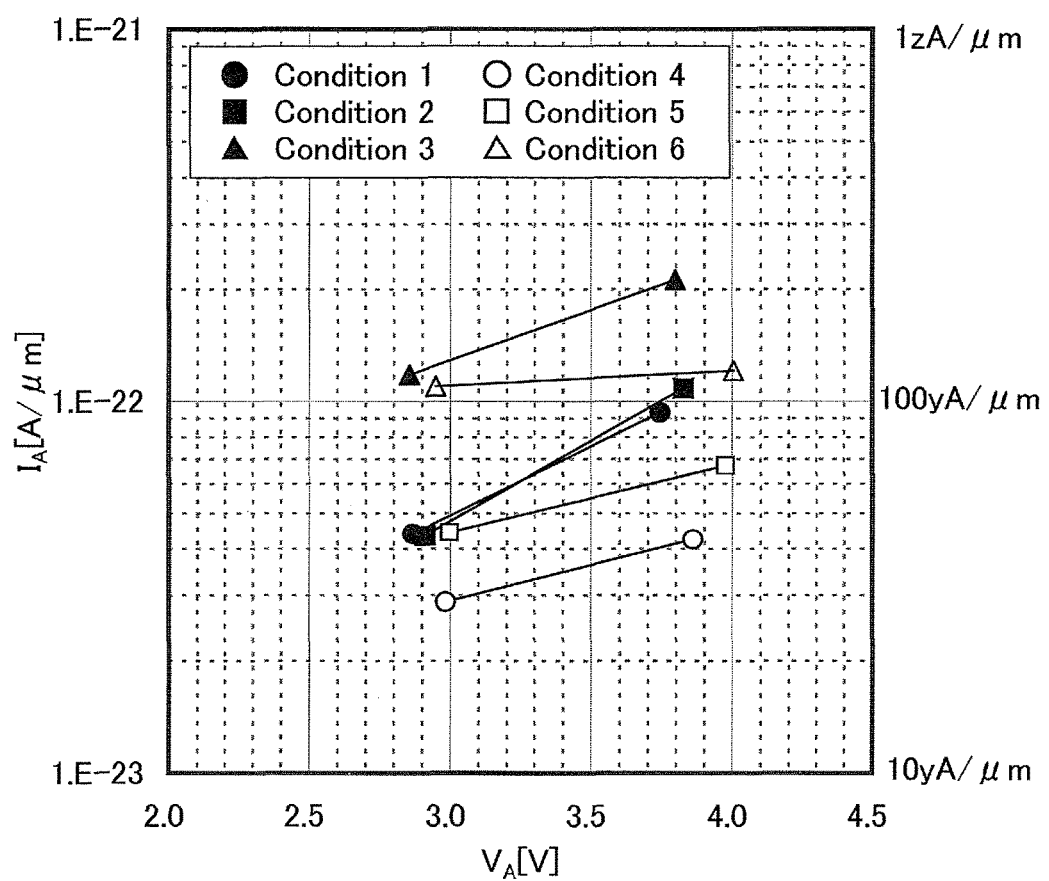
FIG. 14 is a graph showing a relation between voltage of a node A and leakage current estimated from the measurement.

FIG. 14 shows the relation between the voltage of the node A and the leakage current under Conditions 1 to 6 which is estimated from the values obtained in the above measurement. According to FIG. 14, in Condition 4, for example, when the voltage of the node A is 3.0 V, the leakage current is 28 yA/μm. Since the leakage current includes the off-state current of the transistor 812, the off-state current of the transistor 812 can be considered to be 28 yA/μm or less.

Figure 15:
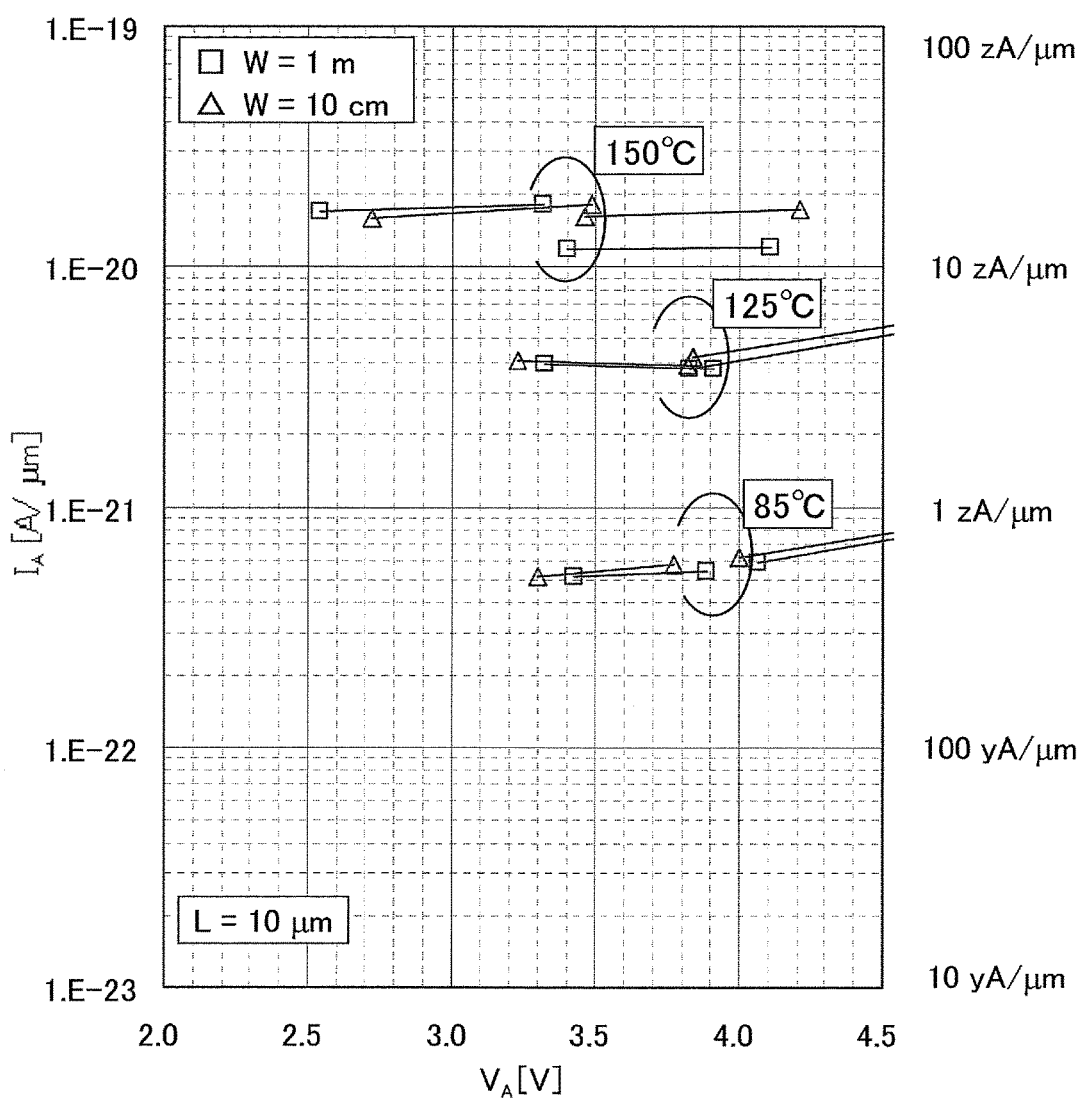
FIG. 15 is a graph showing a relation between voltage of a node A and leakage current estimated from the measurement.
Figure 16:
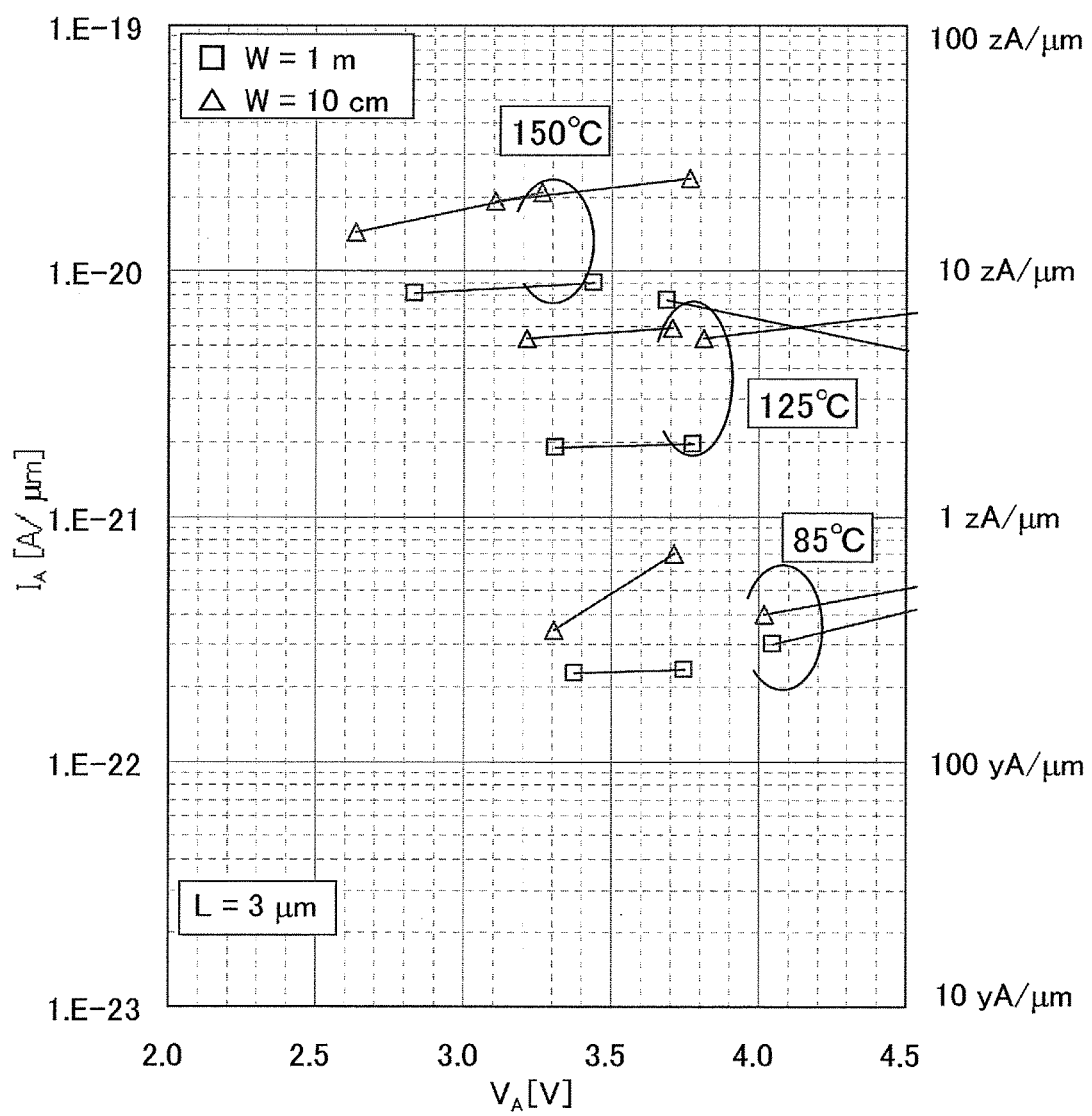
FIG. 16 is a graph showing a relation between voltage of a node A and leakage current estimated from the measurement.
Figure 17:
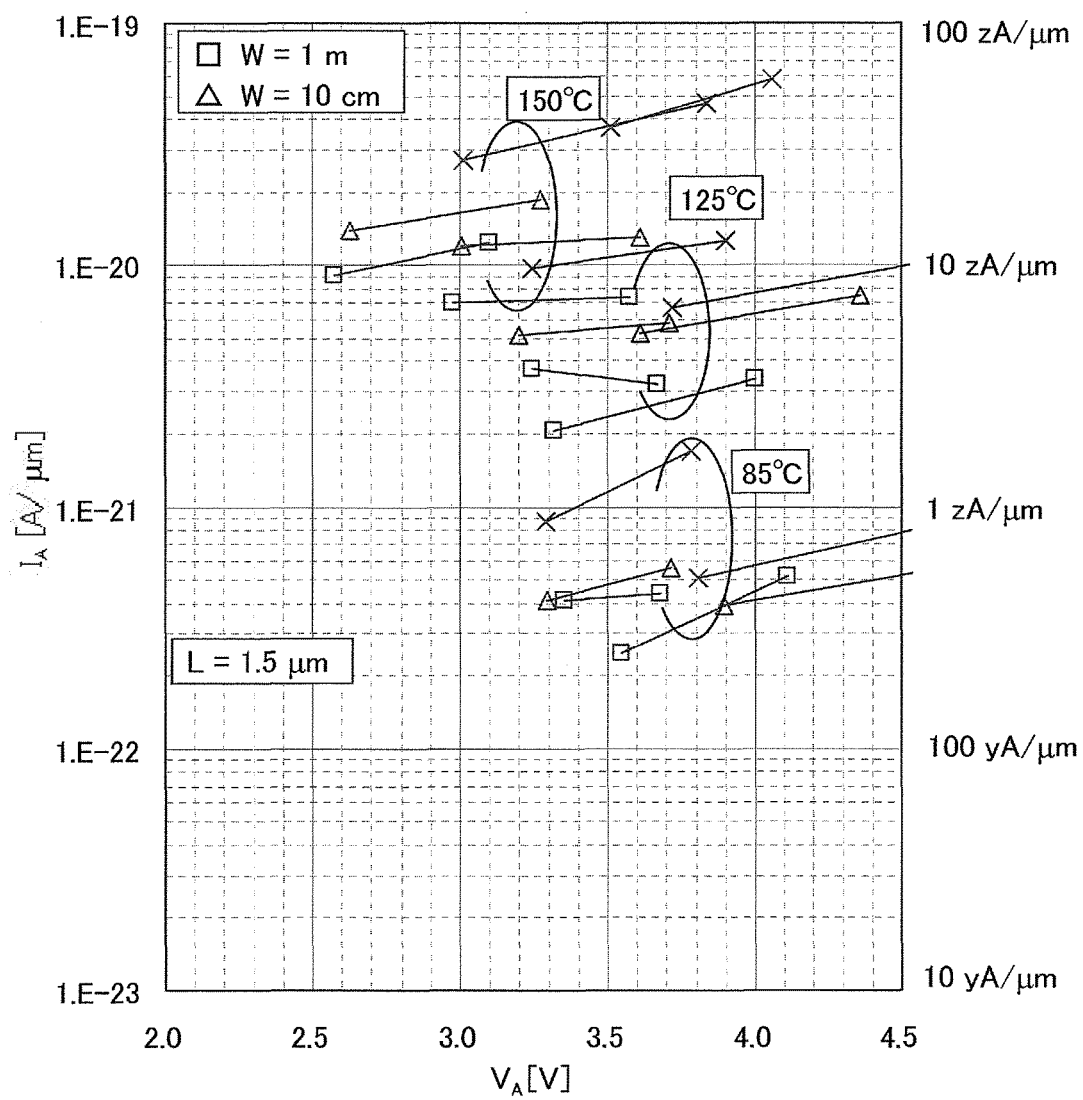
FIG. 17 is a graph showing a relation between voltage of a node A and leakage current estimated from the measurement.

FIGS. 15 to 17 show the relation between the voltage of the node A and leakage current under Conditions 1 to 6 which is estimated from values obtained in the above measurement, at 85° C., 125° C., and 150° C. As shown in FIGS. 15 to 17, even at 150° C., the leakage current is 100 zA/μm or less.

Since, as described above, the leakage current is sufficiently small in the circuit for characteristic evaluation which includes a transistor including a purified oxide semiconductor layer serving as a channel formation layer, it is understood that the off-state current of the transistor is sufficiently small. In addition, the off-state current of the above transistor is sufficiently small even when the temperature rises.

(Embodiment 6)

In this embodiment, an example of a structure of the memory circuit in the above embodiments will be described.

Figure 18A:
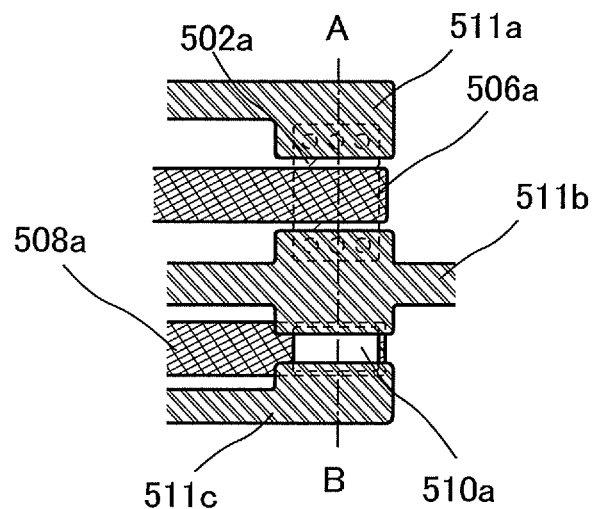
FIGS. 18A and 18B illustrate an example of a structure of a memory circuit in Embodiment 6.
Figure 18B:
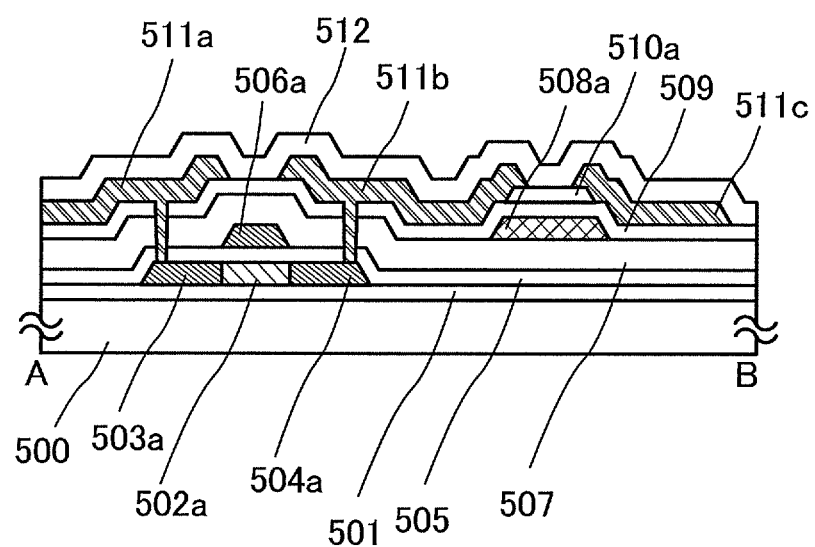
Figure 19A:
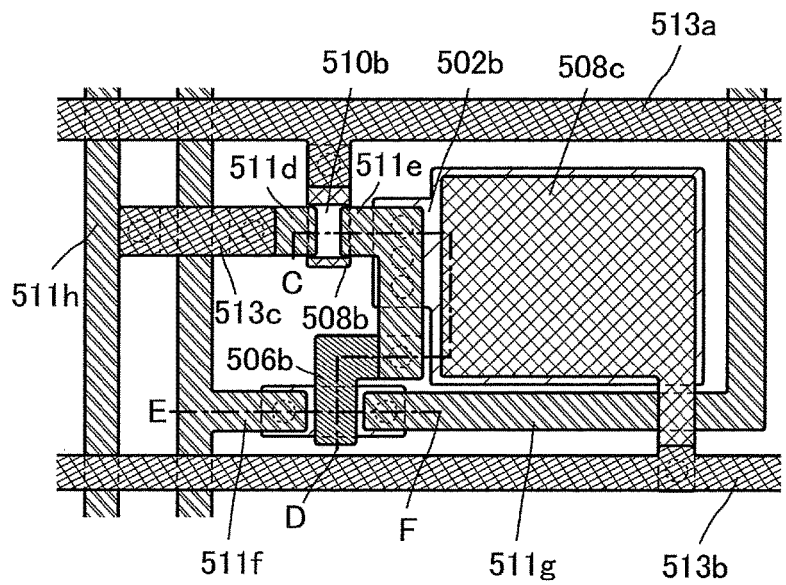
FIGS. 19A to 19C illustrate an example of a structure of a memory circuit in Embodiment 6.
Figure 19B:
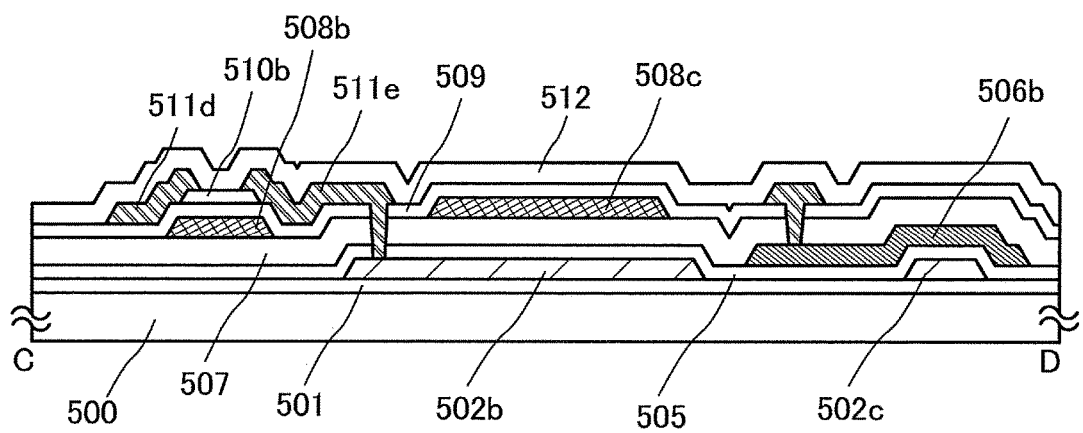
Figure 19C:
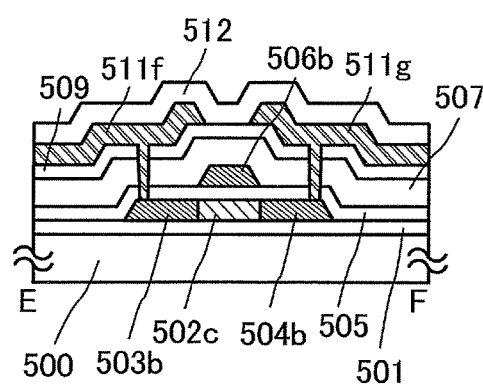

An example of a structure of the memory circuit in this embodiment will be described with reference to FIGS. 18A and 18B and FIGS. 19A to 19C. FIGS. 18A and 18B and FIGS. 19A to 19C illustrate an example of a structure of the memory circuit in this embodiment. FIG. 18A is a schematic plan view of a pulse converter circuit and FIG. 18B is a schematic cross-sectional view taken along line A-B in FIG. 18A. FIG. 19A is a schematic plan view of a memory cell, FIG. 19B is a schematic cross-sectional view taken along line C-D in FIG. 19A, and FIG. 19C is a schematic cross-sectional view taken along line E-F in FIG. 19A. FIGS. 18A and 18B and FIGS. 19A to 19C illustrate, for example, the case where a transistor having the same structure as the transistor described in the above embodiment with reference to FIG. 7A is used as an example of a transistor including an oxide semiconductor layer.

The memory circuit in FIGS. 18A and 18B and FIGS. 19A to 19C includes semiconductor layers 502a to 502c, an insulating layer 505, a conductive layer 506a, a conductive layer 506b, an insulating layer 507, conductive layers 508a to 508c, an insulating layer 509, a semiconductor layer 510a, a semiconductor layer 510b, conductive layers 511a to 511h, an insulating layer 512, and conductive layers 513a to 513c.

Each of the semiconductor layers 502a to 502c is formed over one surface of a substrate 500 with an insulating layer 501 interposed therebetween.

The semiconductor layer 502a includes impurity regions 503a and 504a which are apart from each other. The semiconductor layer 502a serves as a channel formation layer of a p-channel transistor in the pulse converter circuit. The impurity region 503a serves as one of a source region and a drain region of the p-channel transistor in the pulse converter circuit. The impurity region 504a serves as the other of the source region and the drain region of the p-channel transistor in the pulse converter circuit.

The semiconductor layer 502b serves as a first electrode of a storage capacitor in the memory cell.

The semiconductor layer 502c includes impurity regions 503b and 504b which are apart from each other. The semiconductor layer 502c serves as a channel formation layer of an output transistor in the memory cell. The impurity region 503b serves as one of a source region and a drain region of the output transistor in the memory cell. The impurity region 504b serves as the other of the source region and the drain region of the output transistor in the memory cell.

The insulating layer 505 is formed over the one surface of the substrate 500 with the semiconductor layers 502a to 502c and the insulating layer 501 interposed therebetween. The insulating layer 505 serves as a gate insulating layer of the p-channel transistor in the pulse converter circuit, a dielectric layer in the storage capacitor in the memory cell, and a gate insulating layer of the output transistor in the memory cell.

The conductive layer 506a overlaps with the semiconductor layer 502a with the insulating layer 505 interposed therebetween. The conductive layer 506a serves as a gate electrode of the p-channel transistor in the pulse converter circuit.

The conductive layer 506b overlaps with the semiconductor layer 502c with the insulating layer 505 interposed therebetween. The conductive layer 506b serves as a gate electrode of the output transistor in the memory cell.

The insulating layer 507 is formed over the insulating layer 505, the conductive layer 506a, and the conductive layer 506b. The insulating layer 507 serves as a planarization insulating layer.

The conductive layer 508a and the conductive layer 508b are formed over the insulating layer 507.

The conductive layer 508a serves as a gate electrode of an n-channel transistor in the pulse converter circuit.

The conductive layer 508b serves as a gate electrode of a selection transistor in the memory cell.

The conductive layer 508c overlaps with the semiconductor layer 502b with the insulating layer 505 and the insulating layer 507 interposed therebetween. The conductive layer 508c serves as a second electrode of the storage capacitor in the memory cell.

The insulating layer 509 is formed over the insulating layer 507 and the conductive layers 508a to 508c. The insulating layer 509 serves as a gate insulating layer of the n-channel transistor in the pulse converter circuit and a gate insulating layer of the selection transistor in the memory cell.

The semiconductor layer 510a overlaps with the conductive layer 508a with the insulating layer 509 interposed therebetween. The semiconductor layer 510a serves as a channel formation layer of the n-channel transistor in the pulse converter circuit.

The semiconductor layer 510b overlaps with the conductive layer 508b with the insulating layer 509 interposed therebetween. The semiconductor layer 510b serves as a channel formation layer of a selection transistor in the memory cell.

The conductive layer 511a is electrically connected to the impurity region 503a in the semiconductor layer 502a. The conductive layer 511a serves as one of a source electrode and a drain electrode of the p-channel transistor in the pulse converter circuit.

The conductive layer 511b is electrically connected to the impurity region 504a in the semiconductor layer 502b and the semiconductor layer 510a. The conductive layer 511b serves as the other of the source electrode and the drain electrode of the p-channel transistor in the pulse converter circuit and one of a source electrode and a drain electrode of the n-channel transistor in the pulse converter circuit.

The conductive layer 511c is electrically connected to the semiconductor layer 510a. The conductive layer 511c serves as the other of the source electrode and the drain electrode of the n-channel transistor in the pulse converter circuit.

The conductive layer 511d is electrically connected to the semiconductor layer 510b. The conductive layer 511d serves as one of a source electrode and a drain electrode of the selection transistor in the memory cell.

The conductive layer 511e is electrically connected to the semiconductor layer 510b. The conductive layer 511e serves as the other of the source electrode and the drain electrode of the selection transistor in the memory cell.

The conductive layer 511f is electrically connected to the impurity region 503b in the semiconductor layer 502c. The conductive layer 511f serves as one of a source electrode and a drain electrode of the output transistor in the memory cell.

The conductive layer 511g is electrically connected to the impurity region 504b in the semiconductor layer 502c. The conductive layer 511g serves as the other of the source electrode and the drain electrode of the output transistor in the memory cell.

The conductive layer 511h is formed over the insulating layer 509. The conductive layer 511h serves as a bit line to which a data signal is input in the memory cell.

The insulating layer 512 is in contact with the insulating layer 509, the semiconductor layer 510a, the semiconductor layer 510b, and the conductive layers 511a to 511h.

The conductive layer 513a is electrically connected to the conductive layer 508b. The conductive layer 513a serves as a word line to which a row address signal is input in the memory cell. Note that the conductive layer 513a is not necessarily formed; the conductive layer 508b may serve as the word line.

The conductive layer 513b is electrically connected to the conductive layer 508c. The conductive layer 513b serves as a read line to which a read signal is input in the memory cell. Note that the conductive layer 513b is not necessarily formed; the conductive layer 508c may serve as the read line.

The conductive layer 513c is electrically connected to the conductive layers 511d and 511h.

As the substrate 500, a substrate that can be used as the substrate 400*a* in FIG. 7A can be used.

As the insulating layer 501, a layer formed of a material that can be used for the insulating layer 447 in FIG. 7D can be used. The insulating layer 501 may be a stack of layers each formed of a material that can be used for the insulating layer 501.

As the semiconductor layers 502*a* to 502*c*, a semiconductor layer including a semiconductor (such as silicon) belonging to the 14th group of the periodic table can be used.

The impurity regions 503*a* and 504*a* are formed by doping with an impurity element imparting p-type conductivity. The impurity regions 503*b* and 504*b* are formed by doping with an impurity element imparting p-type or n-type conductivity. As an impurity element imparting p-type conductivity, boron can be used, for example. As an impurity element imparting n-type conductivity, phosphorus can be used, for example.

As each of the insulating layers 505 and 509, a layer formed of a material that can be used for the insulating layer 402*a* in FIG. 7A can be used. Each of the insulating layers 505 and 509 may be a stack of layers each formed of a material that can be used for the insulating layers 505 and 509.

As each of the conductive layers 506*a* and 506*b* and the conductive layers 508*a* to 508*c*, a layer formed of a material that can be used for the insulating layer 401*a* in FIG. 7A can be used, for example. Each of the conductive layers 506*a* and 506*b* and the conductive layers 508*a* to 508*c* may be a stack of layers each formed of a material that can be used for the conductive layers 506*a* and 506*b* and the conductive layers 508*a* to 508*c*.

As the insulating layer 507, a layer formed of an organic material such as polyimide, acrylic, or benzocyclobutene can be used. Alternatively, a layer formed of a low-dielectric constant material (also referred to as a low-k material) can be used as the planarization insulating layer. The insulating layer 507 can be a stack of layers each formed of a material that can be used for the insulating layer 507.

As each of the semiconductor layers 510*a* and 510*b*, a layer of a material that can be used for the oxide semiconductor layer 403*a* in FIG. 7A can be used.

As each of the conductive layers 511*a* to 511*h* and the conductive layers 513*a* to 513*c*, a layer of a material that can be used for the conductive layers 405*a* and 406*a* in FIG. 7A can be used. Each of the conductive layers 511*a* to 511*h* and the conductive layers 513*a* to 513*c* may be a stack of layers each formed of a material that can be used for the conductive layers 511*a* to 511*h* and the conductive layers 513*a* to 513*c*.

As the insulating layer 512, a layer formed of a material that can be used for the oxide insulating layer 407*a* in FIG. 7A can be used. The insulating layer 512 may be a stack of layers that can be used for the insulating layer 512.

As described with reference to FIGS. 18A and 18B and FIGS. 19A to 19C, the memory circuit in this embodiment has a structure where the pulse converter circuit and the memory cell are formed over one substrate. With the above structure, the pulse converter circuit and the memory cell can be formed by the same process, which can lead to reduction in manufacturing cost. Note that the memory circuit in this embodiment may have a structure where the pulse converter circuit, the memory cell, and another circuit (one or more of a first driver circuit, a second driver circuit, and a control circuit) are formed over one substrate.

(Embodiment 7)

In this embodiment, information media including the semiconductor device in the above embodiments which can wirelessly transmit and receive signals are described.

Examples of a structure of an information medium in this embodiment will be described with reference to FIGS. 20A to 20D. FIGS. 20A to 20D illustrate examples of a structure of an information medium in this embodiment.

Figure 20A:
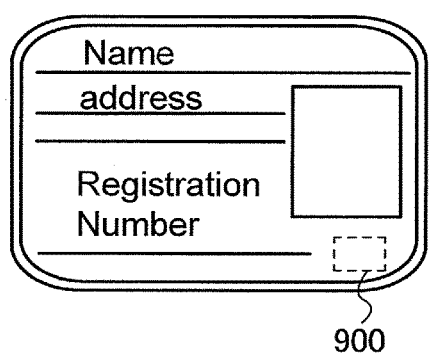
FIGS. 20A to 20D illustrate examples of a structure of an information medium in Embodiment 7.

The information medium in FIG. 20A is an ID card that contains personal data. The ID card in FIG. 20A includes a chip 900. By being provided with the chip 900, the ID card in FIG. 20A can have improved security including forgery prevention. As the ID card, for example, driver's licenses or resident cards can be given. The chip 900 has high reliability and thus is suitable for the ID card and the like which are used for a long period.

Figure 20C:
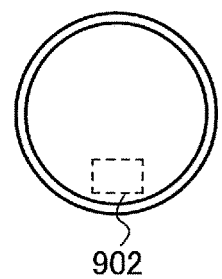
Figure 20B:
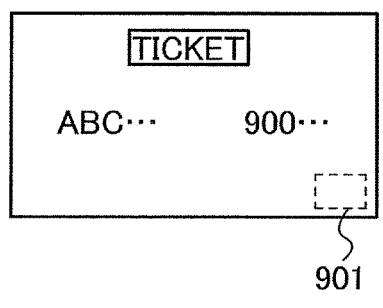

The information medium in FIG. 20B is a ticket-type information medium. The ticket-type information medium in FIG. 20B includes a chip 901. The ticket-type information medium in FIG. 20B is provided with the chip 901 and therefore can store information other than that printed thereon using the chip 901. In addition, by being provided with the chip 901, the ticket-type information medium in FIG. 20B can have improved security including forgery prevention. Since the chip 901 has high reliability, for example, when the ticket information medium becomes unnecessary, the chip 901 can be collected to be reused by being separated from the thicket with a tear-off portion provided in the ticket. As the ticket-type information medium, for example, paper money, railway tickets, securities, or other tickets can be given.

The information medium in FIG. 20C is a coin-type information medium. The coin-type information medium includes a chip 902. The coin-type information medium in FIG. 20C is provided with the chip 902 and therefore can store information other than that printed thereon using the chip 902. In addition, by being provided with the chip 902, the coin-type information medium in FIG. 20C can have improved security including forgery prevention. As the coin-type information medium, for example, coins, railway tickets, securities, or other tickets can be given.

Figure 20D:
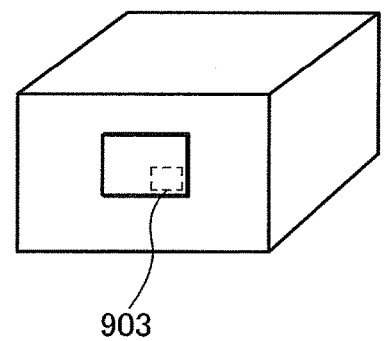

The information medium in FIG. 20D is an article. The article includes a chip 903. The article in FIG. 20D is provided with the chip 903 and therefore can store information other than that printed thereon using the chip 903. In addition, by being provided with the chip 903, the article in FIG. 20D can have improved security including forgery prevention. There is no particular limitation on the article; for example, various articles such as electronic devices and household commodities can be given.

As the chips 900 to 903, for example, the semiconductor device given in the above embodiments, which is capable of wireless communication, can be employed.

As described above with reference to FIGS. 20A to 20D, an example of the information medium in this embodiment includes a chip capable of wireless communication. With the above structure, the area of the circuit can be reduced. In addition, with the above structure, the specific information contained in the information medium including a chip can be read through wireless communication and utilized. As a result, the information medium can be managed more easily with higher security.

This application is based on Japanese Patent Application serial no. 2010-116861 filed with Japan Patent Office on May 21, 2010, the entire contents of which are hereby incorporated by reference.

What is claimed is:

1. A pulse converter circuit comprising:
a logic circuit to which a first signal is input and from which a second signal is output,
wherein the logic circuit comprises:
a p-channel transistor to a gate of which the first signal is input, the p-channel transistor determining whether a voltage of the second signal is set to a first voltage depending on a voltage of the gate; and
an n-channel transistor which is of an enhancement mode, and has a larger absolute value of a threshold voltage than an absolute value of a threshold voltage of the p-channel transistor, and to a gate of which the first signal is input, the n-channel transistor determining whether the voltage of the second signal is set to a second voltage, which is higher than the first voltage, depending on a voltage of the gate,
wherein the p-channel transistor includes a semiconductor layer in which a channel is formed and a group 14 element is included, and
wherein the n-channel transistor includes an oxide semiconductor layer in which a channel is formed and a carrier concentration is less than $1 \times 10^{14}/cm^3$.

2. A pulse converter circuit comprising:
a first inverter to which a first signal is input and from which a second signal is output; and
a second inverter to which the second signal is input and from which a third signal is output,
wherein the first inverter comprises:
a p-channel transistor to a gate of which the first signal is input, the p-channel transistor determining whether a voltage of the second signal is set to a first voltage depending on a voltage of the gate; and
an n-channel transistor which is of an enhancement mode, and has a larger absolute value of a threshold voltage than an absolute value of a threshold voltage of the p-channel transistor, and to a gate of which the first signal is input, the n-channel transistor determining whether the voltage of the second signal is set to a second voltage, which is lower than the first voltage, depending on a voltage of the gate,
wherein the p-channel transistor includes a semiconductor layer in which a channel is formed and a group 14 element is included, and
wherein the n-channel transistor includes an oxide semiconductor layer in which a channel is formed and a carrier concentration is less than $1 \times 10^{14}/cm^3$.

3. A pulse converter circuit comprising:
an input terminal;
a first p-channel transistor including a semiconductor layer containing a group 14 element, wherein a gate of the first p-channel transistor is connected to the input terminal;
a first n-channel transistor including a gate connected to the input terminal;
a first output terminal electrically connected to one of source or drain of the first p-channel transistor and one of source or drain of the first n-channel transistor;
a second p-channel transistor including a semiconductor layer containing a group 14 element, wherein a gate of the second p-channel transistor is connected to the first output terminal;
a second n-channel transistor including a gate connected to the first output terminal;
a second output terminal electrically connected to one of source or drain of the second p-channel transistor and one of source or drain of the second n-channel transistor;
a first voltage terminal electrically connected to the other of source or drain of the first p-channel transistor and the other of source or drain of the second p-channel transistor; and
a second voltage terminal electrically connected to the other of source or drain of the first n-channel transistor and the other of source or drain of the second n-channel transistor,
wherein one of the first n-channel transistor and the second n-channel transistor includes an oxide semiconductor layer.

4. The pulse converter circuit according to claim 3, wherein a voltage of the first voltage terminal is higher than a voltage of the second voltage terminal.

* * * * *